(12) United States Patent
Ueta et al.

(10) Patent No.: US 7,064,357 B2
(45) Date of Patent: Jun. 20, 2006

(54) NITRIDE COMPOUND SEMICONDUCTOR LIGHT EMITTING DEVICE AND METHOD FOR PRODUCING THE SAME

(75) Inventors: Yoshihiro Ueta, Yamatokoriyama (JP); Takayuki Yuasa, Nara (JP); Atsushi Ogawa, Tenri (JP); Yuhzoh Tsuda, Tenri (JP); Masahiro Araki, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/759,312

(22) Filed: Jan. 12, 2001

(65) Prior Publication Data

US 2001/0030329 A1     Oct. 18, 2001

(30) Foreign Application Priority Data

Jan. 14, 2000     (JP)     ............................. 2000-005385

(51) Int. Cl.
    *H01L 31/00*     (2006.01)
(52) U.S. Cl. ....................................... 257/103; 257/628
(58) Field of Classification Search ............ 438/22–47, 438/795–799, 478–509; 257/103, 628
    See application file for complete search history.

(56) References Cited

U.S. PATENT DOCUMENTS

| | | | | |
|---|---|---|---|---|
| 5,587,593 A | * | 12/1996 | Koide et al. .................... | 257/94 |
| 5,742,628 A | * | 4/1998 | Fujii ............................ | 372/45 |
| 5,874,320 A | * | 2/1999 | Shih et al. ..................... | 438/46 |
| 6,030,848 A | * | 2/2000 | Yuge et al. .................... | 438/46 |
| 6,201,823 B1 | * | 3/2001 | Kimura ......................... | 438/46 |
| 6,229,151 B1 | * | 5/2001 | Takenuchi et al. ............. | 257/14 |
| 6,815,726 B1 | * | 11/2004 | Ishida et al. ................... | 257/94 |

FOREIGN PATENT DOCUMENTS

| | | |
|---|---|---|
| JP | 56-059699 A | 5/1981 |
| JP | 02-239188 A | 9/1990 |
| JP | 05-326922 A | 12/1993 |
| JP | 07-201745 A | 8/1995 |
| JP | 09-023026 | 1/1997 |
| JP | 09-036429 A | 2/1997 |
| JP | 09-107124 A | 4/1997 |
| JP | 09-191160 A | 7/1997 |
| JP | 10-075019 A | 3/1998 |
| JP | 10-126006 | 5/1998 |
| JP | 11-074562 A | 3/1999 |
| JP | 11-191657 A | 7/1999 |
| JP | 11-195840 A | 7/1999 |
| JP | 11-233391 | 8/1999 |
| JP | 11-340510 | 12/1999 |
| JP | 2000-082676 A | 3/2000 |

(Continued)

OTHER PUBLICATIONS

Zauner et al , "Homo-epitaxail growth on misoriented GaN substrtae by MOCVD" Mat. Res.Soc.Symp. vol. 595 2000 Materials Research society.*

(Continued)

*Primary Examiner*—Savitri Mulpuri
(74) *Attorney, Agent, or Firm*—Morrison & Foerster LLP

(57) ABSTRACT

A nitride compound semiconductor light emitting device includes: a GaN substrate having a crystal orientation which is tilted away from a <0001> direction by an angle which is equal to or greater than about 0.05° and which is equal to or less than about 2°, and a semiconductor multilayer structure formed on the GaN substrate, wherein the semiconductor multilayer structure includes: an acceptor doping layer containing a nitride compound semiconductor; and an active layer including a light emitting region.

10 Claims, 18 Drawing Sheets

FOREIGN PATENT DOCUMENTS

| | | |
|---|---|---|
| JP | 2000-156348 A | 6/2000 |
| JP | 2000-183460 A | 6/2000 |
| JP | 2000-223743 A | 8/2000 |
| JP | 2001-144326 A | 5/2001 |
| WO | WO-97/26680 A1 | 7/1997 |

OTHER PUBLICATIONS

Japanese Office Action mailed on Mar. 9, 2004, for Japanese Application No. 2000-005385.

Zauner, A.R.A. et al. (1999). "Homoepitaxial Growth on Misoriented GaN Substrates By MOCVD," *Proceedings of the Material Research Society Symposium W (GaN and Related Alloys)* Nov. 28-Dec. 3, 1999, 595:407 (Abstract W6.3).

Japanese Office Action mailed on Aug. 5, 2005 for Japanese Application No. 2000-005385.

* cited by examiner

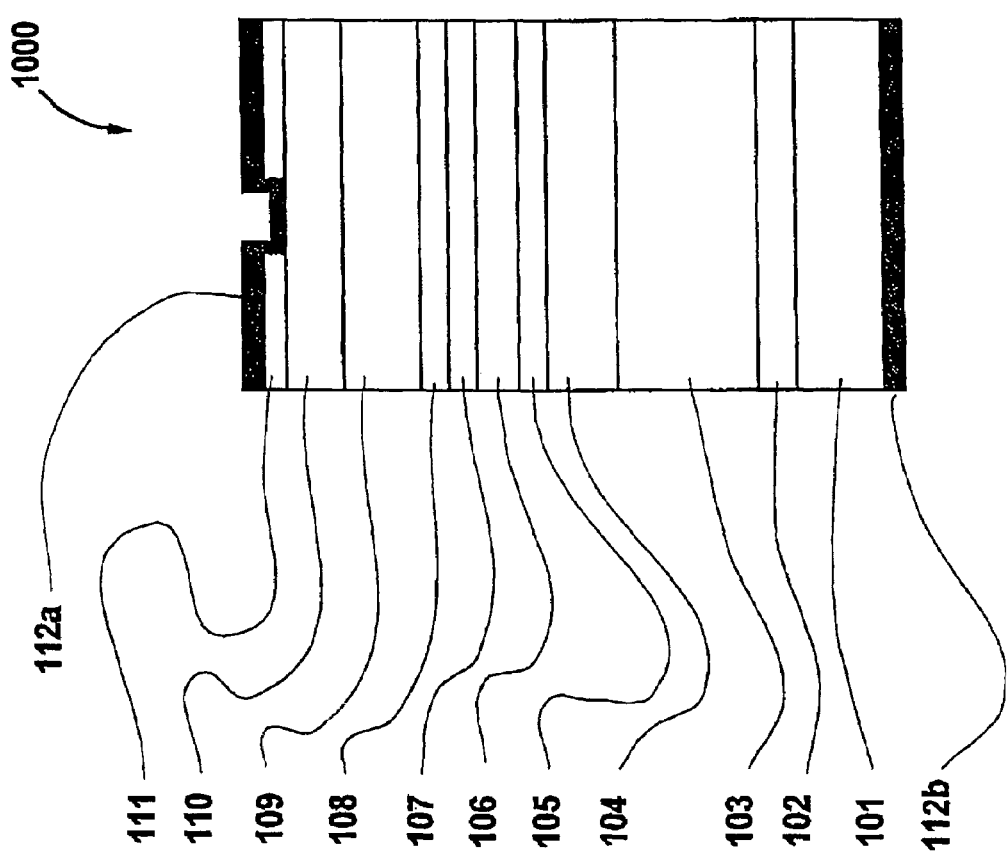

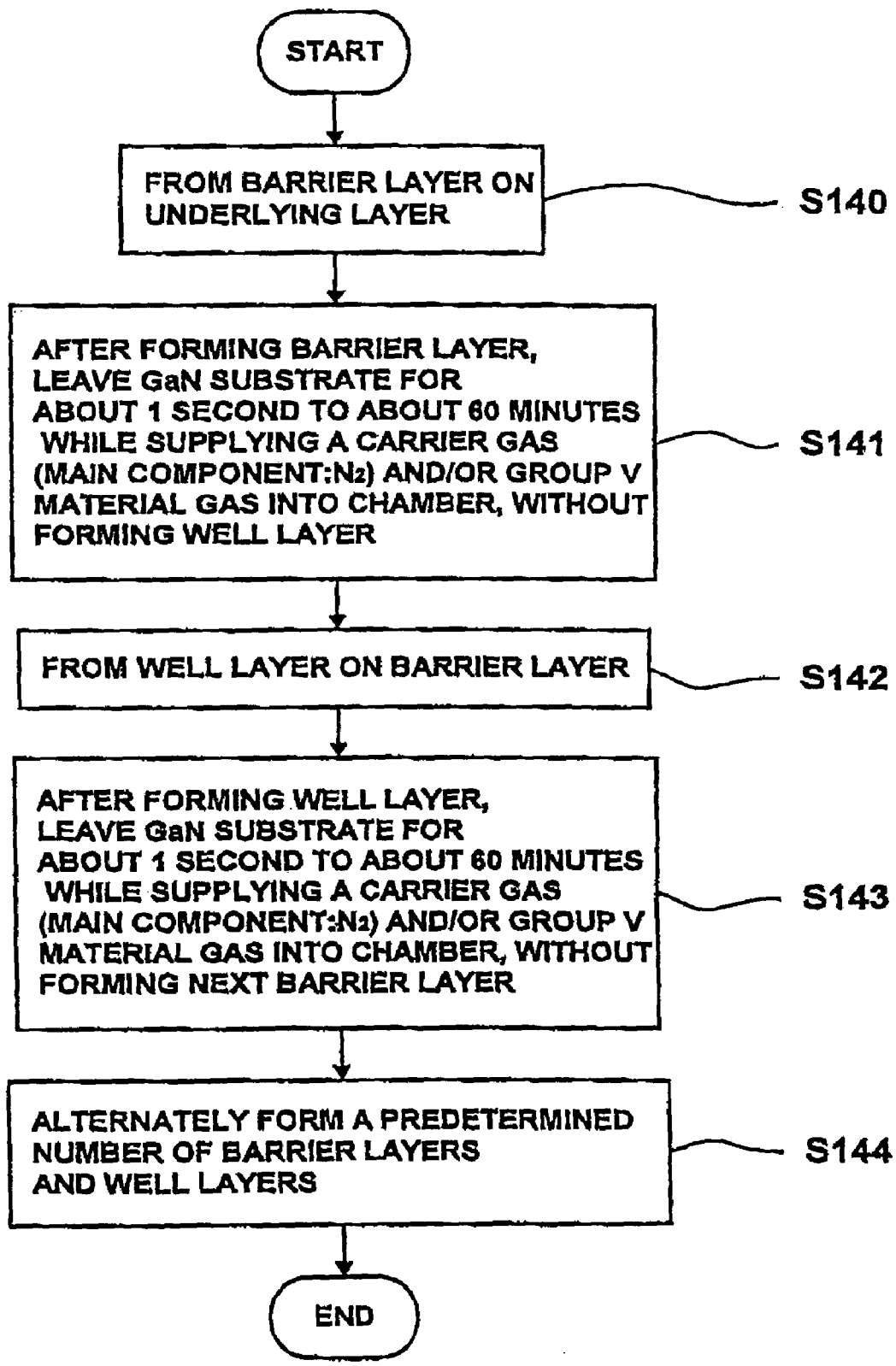

NITRIDE COMPOUND SEMICONDUCTOR LIGHT EMITTING DEVICE AND METHOD FOR PRODUCING THE SAME

BACKGROUND OF THE INVENTION

1. Field of the Invention

The present invention relates to a nitride compound semiconductor light emitting device formed on a GaN substrate, and a method for producing the same.

2. Description of the Related Art

Conventionally, nitride compound semiconductor light emitting devices have been studied or utilized as light emitting devices or high power devices. In the case of light emitting devices, for example, light emitting devices covering a wide range of colors from blue to orange can be technically realized by using nitride compound semiconductors of various compositions. By taking advantage of such properties of nitride compound semiconductors, blue and green light emitting diodes (LEDs) have been realized in recent years. As for laser devices, blue-violet semiconductor laser devices are under development.

By using a nitride compound semiconductor, a light emitting device is typically produced as follows. A current injection layer having n-type properties is formed on a substrate, e.g., a mirror-polished sapphire (0001) substrate, upon which a nitride compound semiconductor is to be epitaxially grown. An active layer and a current injection layer containing an acceptor impurity are further formed thereupon. It is known that the use of a quantum well layer having a thickness of about 10 nm or less for an active layer results in a high emission intensity. The emission wavelength can be varied by adjusting the In (indium) component ratio in an InGaN active layer, for example. After the entire light emitting device structure has been formed, the device is subjected to a heat treatment in an $N_2$ gas, whereby the acceptor is activated, so as to impart p-type properties thereto. Thus, an LED or a laser device is completed.

In general, by doping an n-type nitride compound semiconductor crystal with Si using a $SiH_4$ gas during a crystal growth process, for example, an electron density of $10^{18}$ $cm^{-3}$ or more can be easily obtained. On the other hand, in order to obtain a hole density on the order of $10^{18}$ $cm^{-3}$ with a p-type nitride compound semiconductor crystal, it is necessary to dope the p-type nitride compound semiconductor crystal with Mg using $CP_2Mg$ (Bis(cyclopentadienyl) Magnesium) or $EtCP_2Mg$ (Bis(Ethylcyclopentadienyl) Magnesium) during a crystal growth process, and after the entire light emitting device structure including an active layer has been formed, subject the device to a heat treatment in an inert gas such as $N_2$. A p-crystal having a high hole density "as grown" has not hitherto been obtained.

As used herein, a "high hole density" means a density of $10^{17}$ $cm^{-3}$ or more. The expression "as grown" is used to describe a device which, after crystal growth has taken place, has not been subjected to a heat treatment, electron beam irradiation, etc. An "acceptor doping layer" means a layer which has been doped with an acceptor impurity, e.g., Mg.

The reason why an acceptor doping layer does not exhibit a p-type conductivity "as grown" under the conventional methods is that Mg atoms which are taken into the mother crystal have been inactivated by hydrogen. Specifically, a nitride compound semiconductor crystal which has been formed on a conventional sapphire substrate has a high concentration of defects and/or nitrogen vacancies due to a lattice mismatch as high as 13% with the sapphire substrate. Therefore, Mg atoms cannot be taken into the crystal by themselves, but rather are entrapped in an inactive state, i.e., Mg—H. Accordingly, in order to sever the Mg—H bonds so as to obtain active Mg atoms, it is necessary to apply thermal energy at a temperature on the order of several hundred ° C. in an inert gas atmosphere free of hydrogen after the light emitting device structure has been formed.

However, even after a heat treatment, which damages a thermally unstable active layer containing In, the resultant hole density would be between a latter half of the $10^{17}$ $cm^{-3}$ order to the $10^{18}$ $cm^{-3}$ order. To reduce the operation voltage in a light emitting device, it is necessary to reduce a contact resistance when a p-type is electrode has been formed. Therefore, there is a desire for achieving an increased hole density in a p-type layer. In particular, a device which operates with a high current density, e.g., a laser device, is likely to be heated due to a high contact resistance, so that degradation may begin from an interface between the electrode and the p-type layer, leading to electrode destruction. In addition, excessive heating might cause deterioration associated with the mobility of or increase in dislocations within the light emitting device, resulting in a decrease in the emission intensity or fluctuation in the emission wavelength. Thus, the low hole density level in a p-type layer presently achievable under the conventional technique is detrimental to the emission characteristics and/or longevity of light emitting devices.

Moreover, a light emitting device formed on a conventional sapphire substrate not only suffers from the inactivation of Mg, but also receives unfavorable influences on an InGaN multiple quantum well active layer. As mentioned above, a light emitting device which includes an InGaN quantum well active layer formed on a sapphire substrate has a substantially incommensurate lattice constant with that of the sapphire substrate, and hence has a high concentration of nitrogen vacancies and/or threading dislocations, i.e., dislocations penetrating the device from the substrate interface to the device surface through the quantum well structure. In particular, a current which flows through a threading dislocation is a component which does not contribute to emission, and therefore increases the driving current density in the light emitting device, inducing heating within the light emitting device. Moreover, since a nitride compound semiconductor containing In is very unstable in terms of chemical-thermal equilibrium during a crystal growth process, a high concentration of dislocations are present. In the presence of such a high level of undulation in the underlying layer, each layer in the multiple quantum well structure formed thereon will have a non-uniform thickness.

As a method for solving the problems of dislocations and nitrogen vacancies, Japanese Laid-Open Patent Publication No. 9-23026 discloses a technique of performing a two-part growth involving a buffer layer, where an angle between a sapphire substrate and the (0001) plane is maintained equal to or less than 5°, thereby reducing dislocations and improving emission characteristics. There is also disclosed a technique of, after growing a single quantum well active layer of InGaN, interrupting the growth or observing a watt period for 60 minutes or less to obtain a light emitting device having a uniform emission state and high yield. Japanese Laid-Open Patent Publication No. 10-126006 discloses that a quantum well laser device having a low threshold current density can be formed by forming a well layer to become an active layer in a three-well quantum well structure, observing a wait period for 2 to 10 seconds, and then forming semiconductor layers.

However, in all of the aforementioned conventional techniques, a heat treatment for imparting p-type properties is required after forming a light emitting device structure. Due to an insufficient carrier density, a sufficiently low p-type contact resistance has not been realized. In addition, the problems associated with a heat treatment for imparting p-type properties, e.g., a damaged active layer, non-uniform composition of In-containing layers, non-uniform layer thicknesses, deterioration in crystal quality, etc., have not been solved. Therefore, it is difficult with conventional techniques to produce a high-efficiency LED or a low-threshold semiconductor laser device which requires a reduced operation voltage and/or current. Thus, there to a need for a technique of producing light emitting devices having improved characteristics.

SUMMARY OF THE INVENTION

A nitride compound semiconductor light emitting device according to the present invention includes: a GaN substrate having a crystal orientation which is tilted away from a <0001> direction by an angle which is equal to or greater than about 0.05° and which is equal to or less than about 2°, and a semiconductor multilayer structure formed on the GaN substrate, wherein the semiconductor multilayer structure includes: an acceptor doping layer containing a nitride compound semiconductor; and an active layer including a light emitting region.

In one embodiment of the invention, the acceptor doping layer is composed essentially of $Ga_xIn_yAl_{1-(x+y)}N$ (where $0 \leq x \leq 1$; $0 \leq y \leq 1$; and $0 \leq x+y \leq 1$).

In another embodiment of the invention, the GaN substrate has a crystal orientation which is tilted away from a <0001> direction in a <11-20> or <1-100> direction.

In still another embodiment of the invention, the acceptor doping layer exhibits a p-type conductivity as grown.

In still another embodiment of the invention, the GaN substrate and the active layer are formed so as to be apart from each other by a distance which is equal to or greater than about 1 μm.

In still another embodiment of the invention, the active layer has a quantum well structure, and the active layer has an averaged surface roughness which is equal to or less than a thickness of a well layer in the quantum well structure.

In still another embodiment of the invention, the active layer includes at least one well layer and at least one barrier layer.

A method for producing the nitride compound semiconductor light emitting device according to the present invention includes: after at least one of the at least one well layer and the at least one barrier layer has been formed, observing a wait period during which no other layers are formed, the wait period having a predetermined length.

In one embodiment of the invention, the predetermined length of the wait period is equal to or greater than about 1 second and is equal to or less than about 60 minutes.

In another embodiment of the invention, the method further includes: supplying a carrier gas into a chamber, in which the GaN substrate is placed, during the wait period after at least one of the at least one well layer and the at least one barrier layer has been formed, the carrier gas containing nitrogen as a main component.

In still another embodiment of the invention, the method further includes: supplying a carrier gas and a group V gas Into a chamber, In which the GaN substrate is placed, during the wait period after at least one of the at least one well layer and the at least one barrier layer has been formed, the carrier gas containing nitrogen as a main component.

Thus, the invention described herein makes possible the advantages of providing a high-intensity nitride compound semiconductor light emitting device which emits light with a low operation voltage and/or current.

These and other advantages of the present invention will become apparent to those skilled in the art upon reading and understanding the following detailed description with reference to the accompanying figures.

BRIEF DESCRIPTION OF THE DRAWINGS

FIG. 1A is a schematic cross-sectional view illustrating a semiconductor light emitting device produced by using a nitride compound semiconductor according to the present invention.

FIG. 1D is a flow chart illustrating steps for producing an active layer of a light emitting device according to another embodiment of the invention.

DESCRIPTION OF THE PREFERRED EMBODIMENTS

Figure 2:
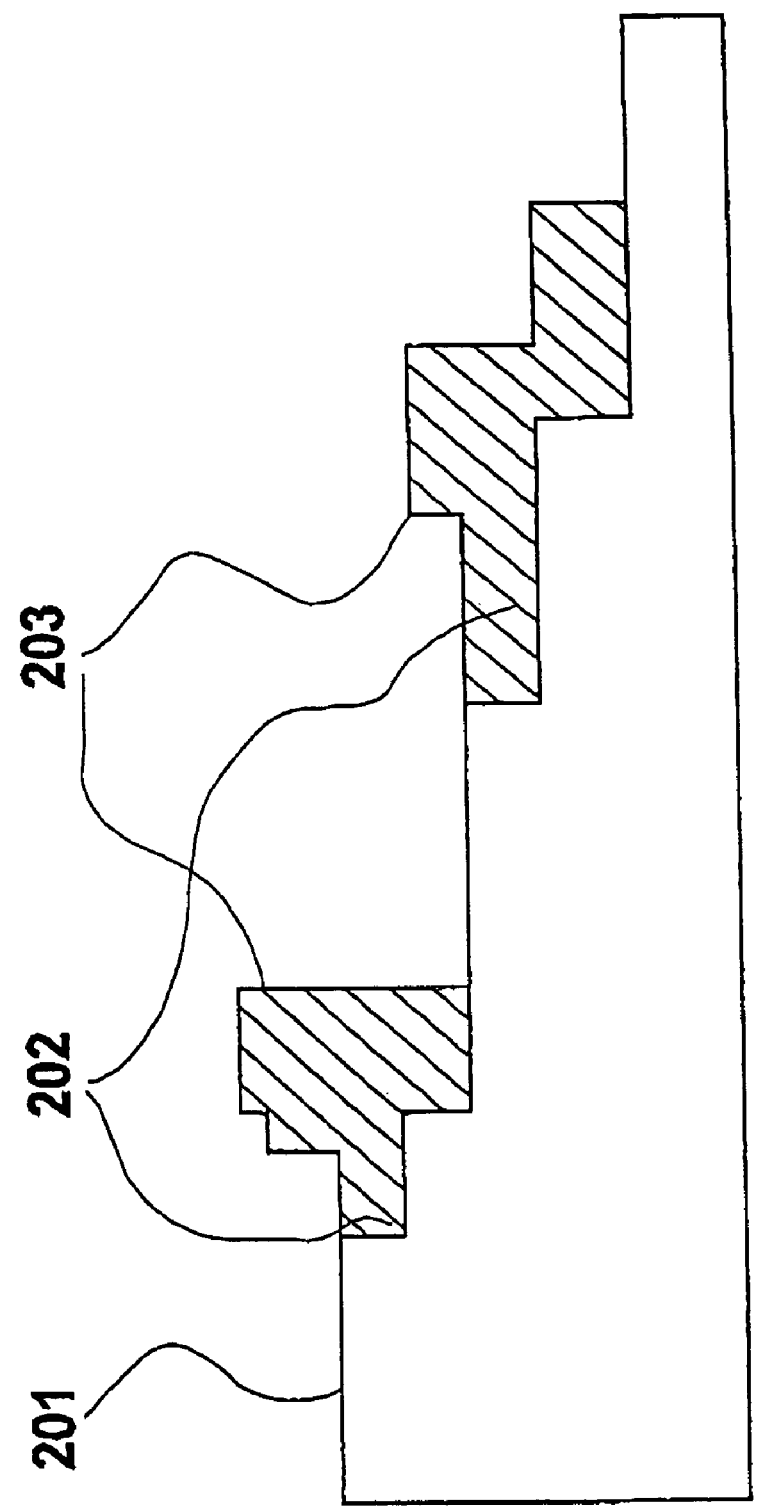
FIG. 2 is a schematic cross-sectional view illustrating a manner in which growth cores may form in a case of a substrate surface having a relatively large tilt angle.

FIG. 2 presents a schematic microscopic observation of surfaces of semiconductor layers grown on a substrate 201 not satisfying a crystal orientation range constraint defined by the present invention. As seen from FIG. 2, there is a non-uniform distribution of steps 202 over the substrate 201, the steps 202 having a height on the order of a few atomic layers. As a result, a three-dimensional growth mode (i.e. local progress of growth) is predominant because non-uniform growth cores 203 hinder an organized step flow growth. Thus, a high concentration of threading dislocations and/or nitrogen vacancies may occur with the growth of semiconductor layers in a thickness direction. Penetration dislocations and/or nitrogen vacancies may result in entrapment of Mg—H. Moreover, a crystal having a high concentration of threading dislocations and/or nitrogen vacancies has a substantially undulated uppermost surface. Such a surface does not provide an appropriate underlying layer for forming a quantum well structure thereon. In particular, it may affect the crystallinity and composition uniformity of an light emitting layer containing In.

Figure 3:
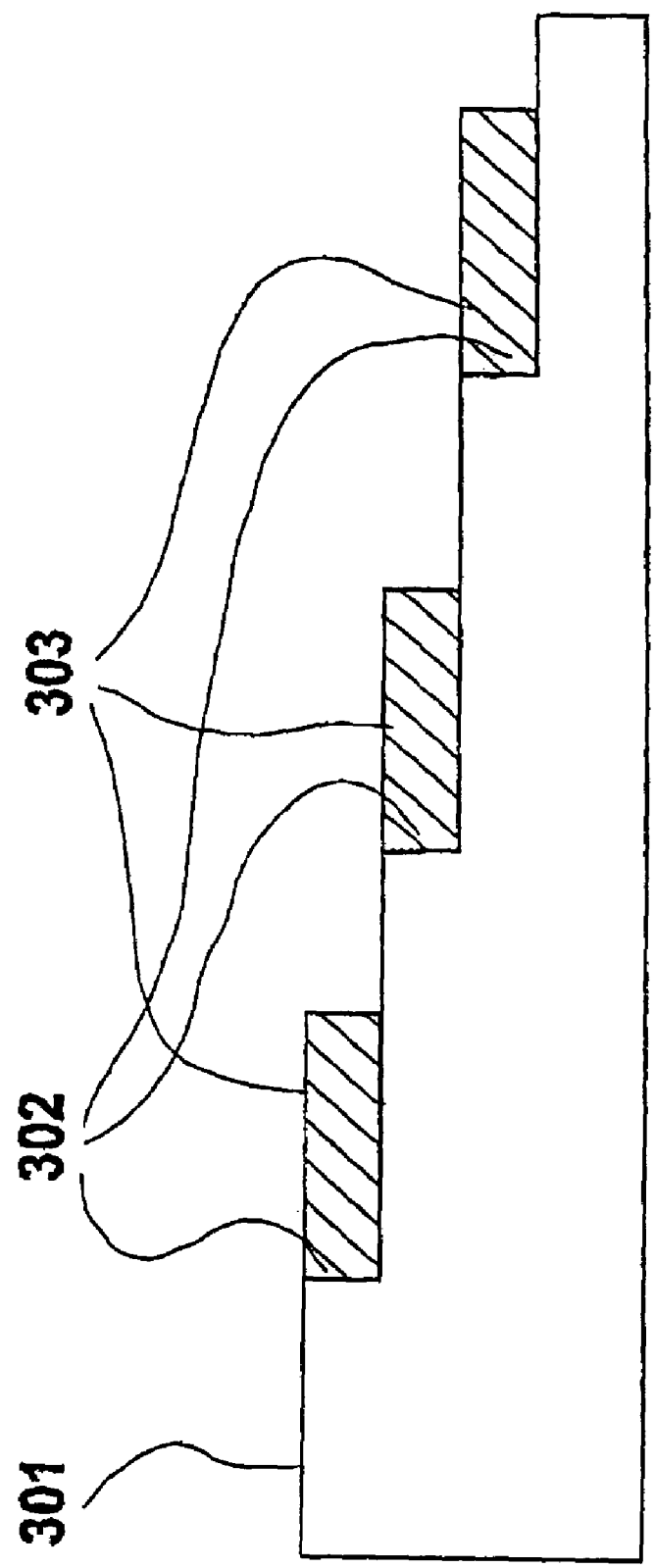
FIG. 3 is a schematic cross-sectional view illustrating a manner in which growth cores may form in a case where a tilt angle from the <0001> direction is defined according to the present invention, whereby surface steps are optimized.

On the other hand, FIG. 3 presents a schematic microscopic observation of surfaces of semiconductor layers grown on a substrate 301 whose crystal orientation is tilted away from a <0001> direction by a slight angle in the range from about 0.05° to about 2° in a <11-20> or <1-100> direction. As shown in FIG. 3, steps 302 on the substrate 301 are distributed in an optimum, uniform manner. As a result, a two-dimensional growth mode occurs in which material species which have arrived at the substrate surface in a vapor phase repeat migration and revaporization, forming a uniform distribution of growth cores 303 over the entire substrate surface, whereby a layer-by-layer planar growth occurs. Thus, the generation of threading dislocations and/or nitrogen vacancies is effectively reduced. Especially in the case of growing a p-type crystal, Mg atoms can be taken into is the crystal by themselves, so that a p-type crystal having a high hole density can be obtained without requiring a heat treatment in an inert gas. Furthermore, as a contact layer, a cladding layer, an optical guide layer, and the like are laminated to a total thickness of about 1 µm or more in a two-dimensional growth mode, the two-dimensional growth progresses based only on the ordered lattice array information inherent in the substrate surface. During the growth process, the steps from which the two-dimensional growth began will gradually disappear, ultimately attaining a very flat uppermost surface. By forming a multiple quantum well active layer on such a highly flat surface, each layer in the multiple quantum well structure will have a uniform thickness, whereby emission characteristics are improved. Due to such effects, the p-type contact resistance can be reduced without particularly performing a p-type properties impartment process, thereby enabling efficient current infection. Thus, a long-life light emitting device which experiences minimum heat generation during use and which has a highly flat surface can be provided.

According to the present invention, a light emitting device including an active layer which is composed of a plurality of layers of In-containing nitride compound semiconductors is produced, using a GaN substrate whose crystal orientation is tilted very slightly from the <0001> direction, in such a manner that underlying layers below the active layer have a total thickness of about 1 µm or more. As a result, a growth mode is realized in which threading dislocations and/or nitrogen vacancies are reduced, and Mg atoms are taken into the mother crystal by themselves. Thus, it is possible to obtain a p-type crystal which is activated to a high density, without performing a heat treatment process after the completion of the device structure which can damage the active layer. As a result, a low resistance p-type contact can be obtained, thereby improving the longevity of the resultant device. By employing the method according to the present invention, threading dislocations are reduced, and hence current paths which do not contribute to emission are reduced. In addition, the flatness of the active layer and the underlying layers is improved. Thus, the thickness of each layer In the InGaN multiple quantum well layers is uniformed, thereby providing improved emission characteristics.

According to another embodiment of the present invention, in addition to using the aforementioned slightly-tilted GaN substrate, a wait period of a predetermined length is observed after a barrier layer and/or a well layer in a multiple quantum well active layer have been formed. As a result, In atoms which may be taken into the solid phase via a small number of sparsely present dislocations are prevented from being concentrated, thereby obtaining a uniform composition. This effect is enhanced by the reduction of threading dislocations as realized by the use of a slightly-tilted GaN substrate and forming underlying layers to a total thickness of about 1 µm or more on the slightly-tilted GaN substrate. In contrast, a high concentration of threading dislocations are present in the crystal grown on a conventional substrate, and In atoms do not diffuse throughout the layers, but rather concentrate around the dislocations because of a small averaged distance between dislocations. The use of a slightly-tilted GaN substrate as defined above alone is effective for reducing the concentration of threading dislocations, but when combined with a wait period as defined above, also eliminated In concentration around dislocations.

As methods for growing a nitride compound semiconductor, metal organic chemical vapor deposition (MOCVD), molecular beam epitaxy (MBE), and halide vapor phase epitaxy (HVPE) are in use. Among others, MOCVD techniques are generally used from the perspective of crystallinity and productivity. Hereinafter, examples of semiconductor light emitting devices according to the present invention will be described.

EXAMPLE 1

FIG. 1A is a schematic cross-sectional view illustrating a light emitting device 1000 according to the present invention. First, a GaN substrate 101 whose crystal orientation is tilted away from the <0001> direction by an angle in the range from about 0.05° to about 2° in the <11-20> or <1-100> direction is prepared. In the present specification, a substrate as defined above will be referred to as a "slightly-tilted substrate".

Upon the slightly-tilted GaN substrate 101, a GN buffer layer 102, an n-GaN layer 103, an n-AlGaN light confining layer 104 for confining light emitted from an active layer, and a GaN lower optical guide layer 105 are laminated in this order to a total thickness of about 1 µm or more. The GaN buffer layer 102 is optional and can be omitted. The lower optical guide layer 105 may be doped so as to have n-type properties. Further layers that may generally be used for a light emitting device, e.g., a crack prevention layer and/or a carrier barrier layer, may be added to the semiconductor light emitting device 1000. Furthermore, the Al component ratio and the electron density in the n-AlGaN light confinement layer 104 can be appropriately selected in accordance with desired device characteristics.

Figure 1B:
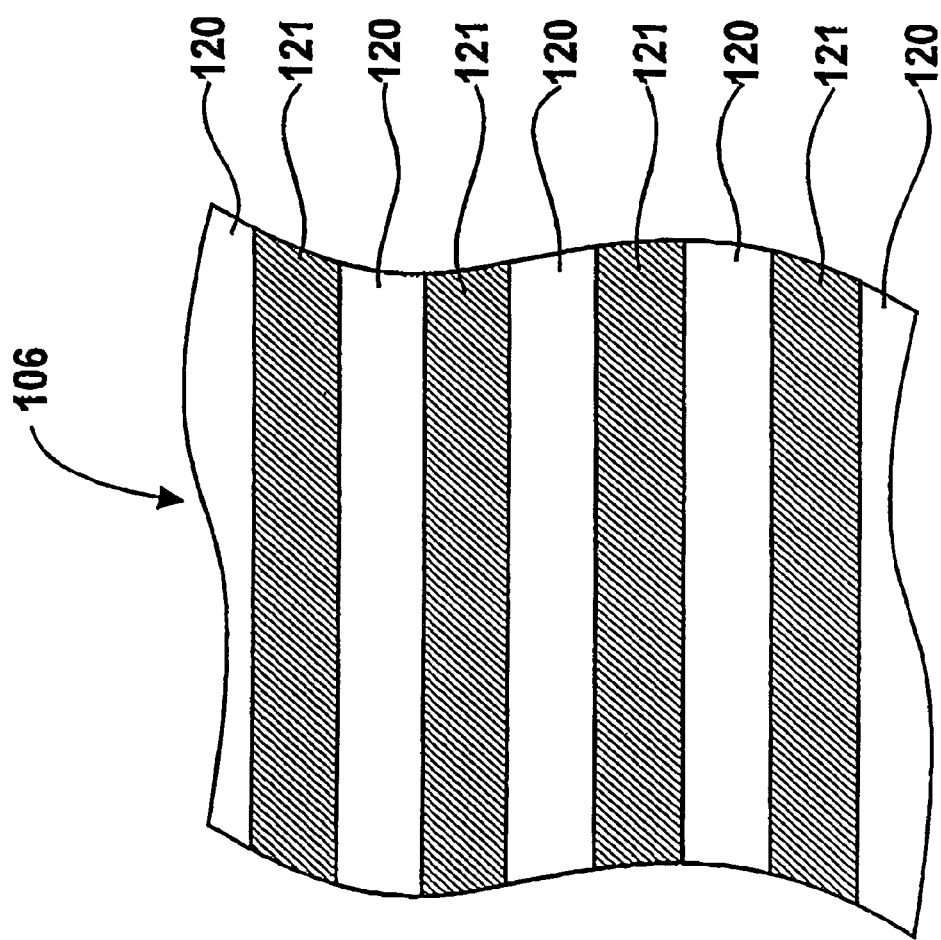
FIG. 1B is a schematic cross-sectional view illustrating the structure of an active layer of a light emitting device produced according to the present invention.

Upon these layers, an active layer 106 as a light emitting region is formed, the active layer 106 including a lamination of InGaN barrier layers 120 (FIG. 1B) and InGaN well layers 121 (FIG. 1B). FIG. 1B shows the internal structure of the active layer 106 including alternate layers of the barrier layers 120 and the well layers 121. The In component ratio in the InGaN barrier layers 120 and the InGaN well layers 121 in the active layer 106, and the number of repetitive units each including one InGaN barrier layer and one InGaN well layer 121 can be arbitrarily selected in accordance with the desired emission wavelength. An AlGaN layer 107 for preventing evaporation of InGaN and/or diffusion of an acceptor impurity from p-type layers is formed immediately above the active layer 106. The thickness and the Al component ratio of the AlGaN layer 107 can be arbitrary selected. In some embodiments, the AlGaN layer 107 may be omitted.

In contact with the AlGaN layer 107, a GaN optical guide layer 108, and a p-AlGaN light confinement layer 109 are laminated in this order. The component ratios, thickness, and hole density levels of these layers can be arbitrarily selected, as is also the case for the GaN lower optical guide layer 105 and the n-AlGaN light confinement layer 104. As an uppermost layer that is In contact with the p-AlGaN layer 109, a p-GaN contact layer 110 is provided. On the p-GaN layer 110, a stripe-shaped p-electrode 112a is formed with an insulation layer 111 interposed therebetween. The insulation layer 111 is provided for the purpose of current confinement. An n-electrode 112b is formed on a bottom face of the slightly-tilted GaN substrate 101.

Although the slightly-tilted GaN substrate 101 used An the multilayer structure illustrated in FIG. 1A is of an n-type, it is also applicable to employ a slightly-tilted p-GaN substrate. In such a case, the respective layers in the multilayer structure shown in FIG. 1A have reverse conductivity types (i.e., n-type layers for p-type layers, and vice versa), and the n-electrode 112b is formed on the uppermost surface of the light emitting device, whereas the p-electrode 112a is formed on the bottom face of the slightly-tilted p-GaN substrate 101.

Figure 4:
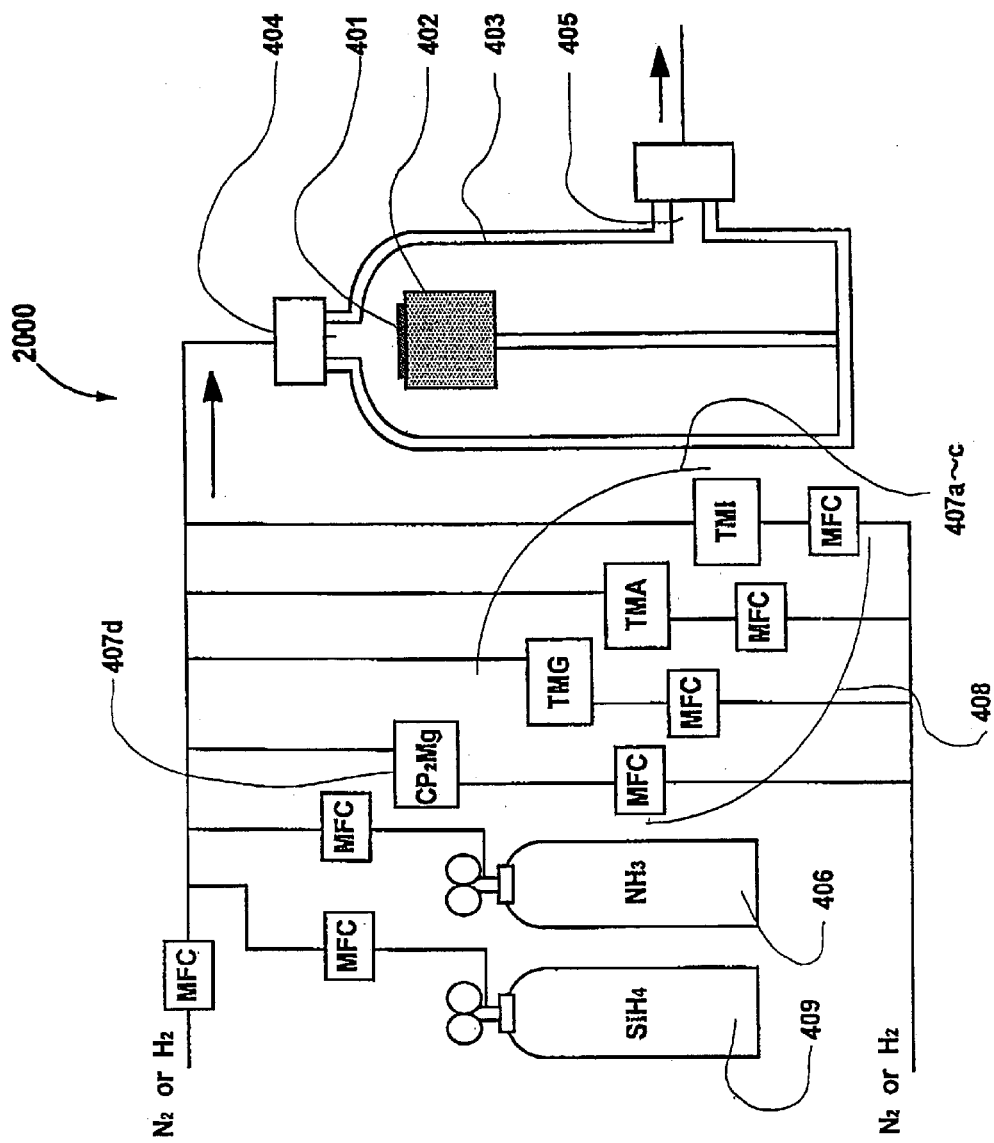
FIG. 4 is a schematic block diagram illustrating a crystal growth apparatus which may be used in the present invention.

FIG. 4 is a schematic block diagram illustrating an MOCVD apparatus 2000 used for the production of the light emitting device according to the present example. In FIG. 4, a GaN substrate 401 is a (0001) plane GaN substrate whose crystal orientation is tilted away from the <0001> direction by a slight angle in the range from about 0.05° to about 2° in the <11-20> or <1-100> direction. The GaN substrate 401 is disposed on a susceptor 402 made of carbon. In the susceptor 402 is provided a resistance-heating type heater made also of carbon (not shown). The substrate temperature can be monitored by means of a thermocouple and controlled. A water-cooled reaction tube 403 has a double-tube structure of quartz. Ammonia 406 is used as a group V material, and trimethylgallium (hereinafter "TMG") 407a, trimethylaluminum (hereinafter "TMA") 407b, and trimethylindium (hereinafter "TMI") 407c are used as group III materials by being bubbled with nitrogen or hydrogen gas. SiH$_4$ 409 is used as an n-type donor material for doping. Bis(cyclopentadienyl) magnesium (hereinafter "CP$_2$Mg") 407d is used as a p-type acceptor material for doping via a material inlet 404. The respective materials are introduced into the reaction tube 403, with their amounts being controlled by means of a respective mass flow controller 408, and expelled from an discharge gas outlet 405.

Next, an exemplary crystal growth procedure for forming the semiconductor light emitting device 1000 as a nitride compound semiconductor laser/LED will be described with reference to FIG. 1A.

First, the substrate 101 (corresponding to the GaN substrate 401) is washed and thereafter placed in the crystal growth apparatus (corresponding to the MOCVD apparatus 2000). The substrate 101 is subjected to a heat treatment in an NH$_3$ atmosphere for about 10 minutes at about 1100° C., and thereafter cooled to a temperature in the range from about 500° C. to about 600° C. Once a stable temperature is achieved, the carrier gas is changed to nitrogen.

The nitrogen gas is supplied at a total flow rate of about 10 l/min, and ammonia is supplied at a flow rate of about 3 l/min. Several seconds later, TMG is supplied at a flow rate of about 20 µmol/min. Thus, the GaN buffer layer 102 is grown for 1 minute at a relatively low temperature so as to have a thickness of about 20 nm. After stopping the supply of TMG and elevating the temperature to about 1050° C., TMG and an SiH$_4$ gas are supplied at flow rates of about 50 µmol/min and about 10 nmol/min, respectively. Thus, the n-GaN layer 103 is grown so as to have a thickness of about 4 µm.

Next, TMA is supplied at a flow rate of about 10 µmol/min, thereby growing the n-Al$_{0.15}$Ga$_{0.85}$N light confinement layer 104 so an to have a thickness of about 0.5 µm. Note that the light confinement layer 104 is not required when producing an LED. Next, the supply of TMA is stopped, and the GaN optical guide layer 105 is grown so as to have a thickness of about 0.1 µm. The optical guide layer 105 is not required when producing an LED.

Thereafter, the supply of SiH$_4$ and TMG is stopped, and the substrate temperature is lowered to a temperature in the range from about 850° C. to about 700° C. The substrate temperature at this stage serves as a parameter which determines the emission wavelength of the resultant light emitting device. The lower the temperature, the longer the emission wavelength. The aforementioned substrate temperature range of about 850° C. to about 700° C. is for producing violet to green light emitting devices; a different temperature range can be used to produce a light emitting device which is outside the violet to green spectrum.

Once a stable temperature is achieved, TMG and TMI are supplied respectively at a flow rate of about 10 µmol/min, thereby forming an In$_{0.05}$Ga$_{0.95}$N barrier layer 120 (FIG. 1B; having a thickness of about 5 nm) of the active layer 106. During the growth of the active layer, SiH$_4$ may be supplied at a flow rate of about 10 nmol/min. After the growth of the barrier layer 120 is complete, the supply of TMG and TMI is temporarily stopped, and a wait period (from about 1 second to about 60 minutes) is observed while supplying a carrier gas and an NH$_3$ gas. Thereafter, TMG and TMI are supplied at flow rates of about 10 µmol/min and about 50 nmol/min, respectively. Thus, an $In_{0.05}Ga_{0.95}N$ well layer 121 (FIG. 1B; having a thickness of about 3 nm) of the active layer 106. After the growth of the well layer 121, the supply of TMG and TMI is again stopped, and a wait period (from about 1 second to about 60 minutes) is observed while supplying a carrier gas and an $NH_3$ gas.

The growth of well layers 121 and barrier layers 120 of the active layer 106 is repeated. After a multiple quantum well structure having a desired number layers has been formed, a final barrier layer 120 is grown, thereby completing the growth of the active layer 106. It has been found that a light emitting device having 2 to 5 well layers 121 generally has an optimum emission efficiency.

After the growth of the active layer 106, TMG (about 10 μmol/min), TMA (about 5 μmol/min), and $CP_2Mg$ are supplied, thereby growing the AlGaN layer 107 (having a thickness of about 30 nm) in order to prevent sublimation of the InGaN layer. Thereafter, the supply of TMG, TMA, and $CP_2Mg$ is stopped, and the substrate temperature is again elevated to about 1050° C. After the temperature elevation, TMG (about 50 μmol/min) and $CP_2Mg$ are supplied, thereby growing the GaN optical guide layer 108 so as to have a thickness of about 0.1 μm. The optical guide layer 108 is not required when producing an LED.

Next, TMA is supplied at a flow rate of about 10 μmol/min, thereby growing the p-$Al_{0.15}Ga_{0.85}N$ light confinement layer 109 so as to have a thickness of about 0.5 μm. The light confinement layer 109 is not required when producing an LED. After completing the growth, the supply of TMA is stopped, the p-GaN layer 110 is grown so as to have a thickness of about 0.5 μm. After completing the growth, the supply of TMG and $CP_2MG$ is stopped, and the substrate heating is stopped.

Figure 5:
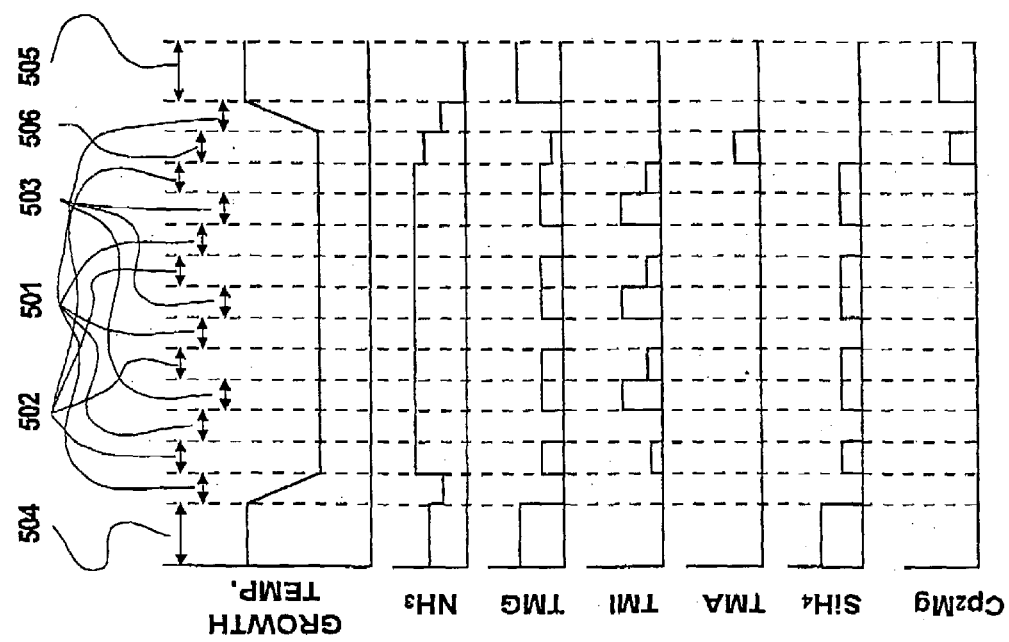
FIG. 5 is a graph illustrating a schedule of growth temperatures in the vicinity of an active layer and flow rates of respective materials according to the present invention.

FIG. 5 is a graph illustrating a schedule of growth temperatures in the vicinity of the active layer and the flow rates of respective materials according to the present example of the invention. Illustrated in FIG. 5 are: wait periods 501, barrier layer growth periods 502, well layer growth periods 503, an n-GaN layer growth period 504, a p-GaN layer growth period 505, and an AlGaN sublimation prevention layer growth period 506.

Once the substrate temperature becomes equal to about room temperature, the substrate 101 is taken out from the crystal growth apparatus. A portion of the n-GaN layer 103 is exposed through reactive ion etching, and the insulation layer 111 of a desired configuration, the p-electrode 112a, and the n-electrode 112b are formed by a vapor deposition method. The substrate is cleaved to create end faces through which light can be emitted.

In the case where the semiconductor light emitting device 1000 is formed as an LED, it is unnecessary to form end faces by cleaving the semiconductor multilayer structure. Rather, light is emitted through the p-electrode 112a and/or the n-electrode 112b.

Although the present example illustrates the use of the GaN buffer layer 102 as a low temperature buffer layer, this layer may be omitted. Alternatively, $Al_xGa_{1-x}N$ ($0 \leq x \leq 1$) may be used for this layer, without substantially affecting the production of the semiconductor light emitting device 1000. The heat treatment in an $NH_3$ atmosphere may also be omitted. It is also possible to apply an elevated temperature in an atmosphere of a carrier gas (whose main component is an inert gas) and $NH_3$, and start the growth of the underlying GaN layer 102 concurrently with the introduction of TMG and/or $SiH_4$.

In the case of using a GaN substrate 101, it is unnecessary to perform a heat treatment in a hydrogen atmosphere and a growth process for a buffer layer 102 at a low temperature. It is also possible to apply an elevated temperature in an atmosphere of a carrier gas (whose main component is an inert gas) and $NH_3$, and start the growth of the underlying GaN layer 103 concurrently with the introduction of TMG and/or $SiH_4$.

The semiconductor light emitting device 1000 thus produced operates with a reduced operation voltage and/or current as compared with those required for conventional semiconductor light emitting devices, and yet has a greater emission intensity than that provided by conventional semiconductor light emitting devices. In the case where the semiconductor light emitting device 1000 is implemented as a laser device, unwanted heating is minimized owing to the low contact resistance in the p-type layers, and deterioration occurs only very slowly, if at all. Thus, a long-life laser device can be realized. These advantages according to the present invention are obtained for the following reasons.

According to the present invention, a light emitting region is formed on a slightly-tilted GaN substrate 101, so that an organized step flow growth is realized, substantially reducing threading dislocations and/or nitrogen vacancies within the crystal. As a result, Mg, as a p-type dopant, can be easily taken into the crystal by itself, i.e., without being bound to hydrogen atoms. Thus, the acceptor doping layer is imparted with a low-resistance p-type conductivity without requiring any particular post-processing after growth, so that there is no need to perform a heat treatment which would damage the active layer 106.

Moreover, by forming the underlying layers between the substrate 101 and the active layer 106 so as to have a total thickness of about 1 μm or more, the steps on the uppermost surface of the substrate 101 are sufficiently flattened, so that it is ensured that the active layer 106 attains a uniform structure in which the fluctuation in the thicknesses of the barrier layers 120 and the well layers 121 is minimized.

Furthermore, reduced threading dislocations and/or nitrogen vacancies and the wait period which is observed during the growth process together allow the active layer 106 to have a uniform In composition, whereby areas having a high concentration of In atoms, which would be rendered incapable of light emission, can be substantially eliminated. In particular, immediately after an In-containing nitride compound semiconductor layer has been grown, the crystal is not in a sound state because a nitride compound semiconductor containing In, when grown at a high temperature, is in a chemically unstable state, and dislocations penetrating through the film cause In atoms to concentrate. Therefore, by forming nitride compound semiconductor layers so as to have a total thickness of about 1 μm or more on a slightly-tilted substrate, the density of threading dislocations is reduced and the uppermost surface is flattened, and with the further application of heat in a nitrogen atmosphere, the In concentration within the In-containing nitride compound semiconductor layer is substantially eliminated, whereby a stable phase is obtained. Thus, the crystal attains a sound state. In particular, the crystallinity of the barrier layers 120 adjoining the wall layers 121, which contribute to the light emission is greatly improved.

EXAMPLE 2

In Example 2 of the present invention, a semiconductor light emitting device 1000 in the form of an LED is produced, using a slightly-tilted substrate 101. In the present example, the relationship between a tilting angle of a slightly-tilted substrate and density of threading dislocations present in the semiconductor light emitting device 1000, surface roughness, and emission intensity with current injection will be discussed.

By using a GaN substrate 101 having a mirror-polished (0001) plane whose crystal orientation is actually tilted away from the <0001> direction by a slight angle in the range from about 0.02° to about 5° in the <11-20> or <1-100> direction, a nitride compound semiconductor multilayer structure is grown in the manner shown in Example 1.

After an n-GaN layer 103 is formed, growth conditions for the active layer 106 are adjusted so that a constant substrate temperature is maintained while supplying $NH_3$. Once a stable substrate temperature is achieved, TMG, TMI, and $SiH_4$ are supplied, at flow rates of about 10 µmol/min, about 10 µmol/min, and 5 nmol/min, respectively, thereby forming an $In_{0.05}Ga_{0.95}N$ barrier layer 120 (FIG. 1B) within an active layer 106 so as to have a thickness of about 5 nm. Next, TMG, TMI, and $SiH_4$ are supplied, at flow rates of about 10 µmol/min, about 50 µmol/min, and 5 nmol/min, respectively, thereby forming an $In_{0.2}Ga_{0.8}N$ well layer 121 within the active layer 106 so as to have a thickness of about 3 nm. After growing the well layer 121, the TMG supply is reduced to about 10 µmol/min, and another barrier layer 120 within the active layer 106 is grown. After that barrier layer 120 has been grown, another well layer 121 is grown, and so forth; this process is repeated until a final barrier layer 120 is grown.

Thereafter, an AlGaN layer 107 for preventing sublimation of the InGaN layer is grown so as to have a thickness of about 30 nm, following the method described in Example 1. According to the present example, the active layer 106 includes three well layers 121. After growing the AlGaN layer 107, a p-type semiconductor multilayer structure is formed, and electrodes are formed, in the manner described in Example 1. Thus, the semiconductor light emitting device 1000 as an LED is completed.

Figure 6:
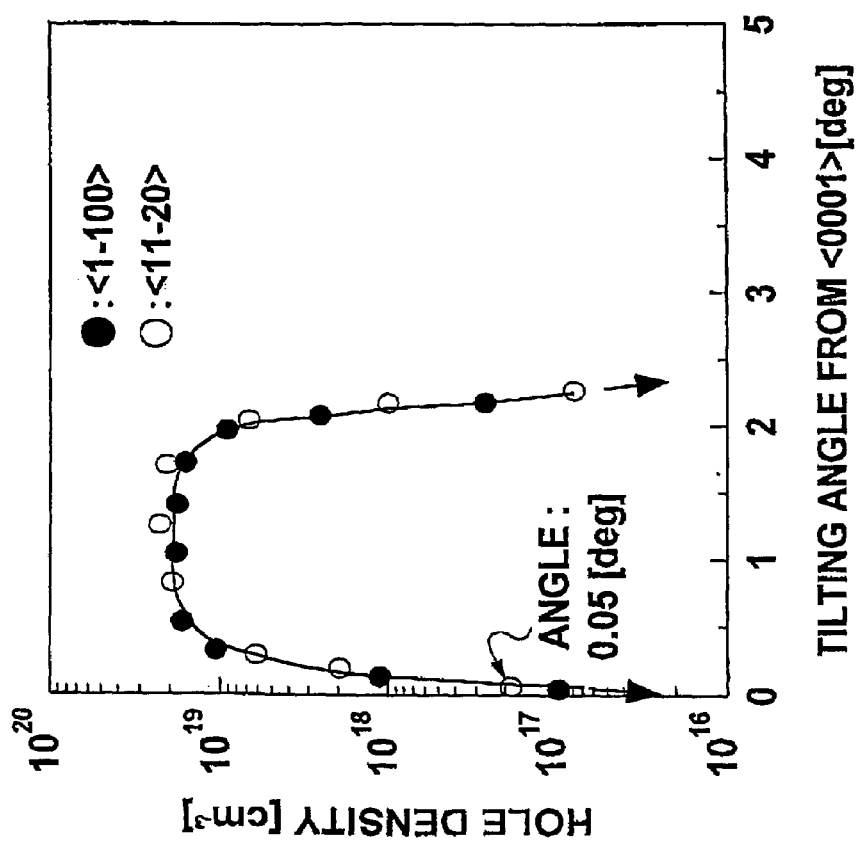
FIG. 6 is a graph illustrating a relationship between the tilt angle of a substrate surface and hole density according to the present invention.
Figure 7:
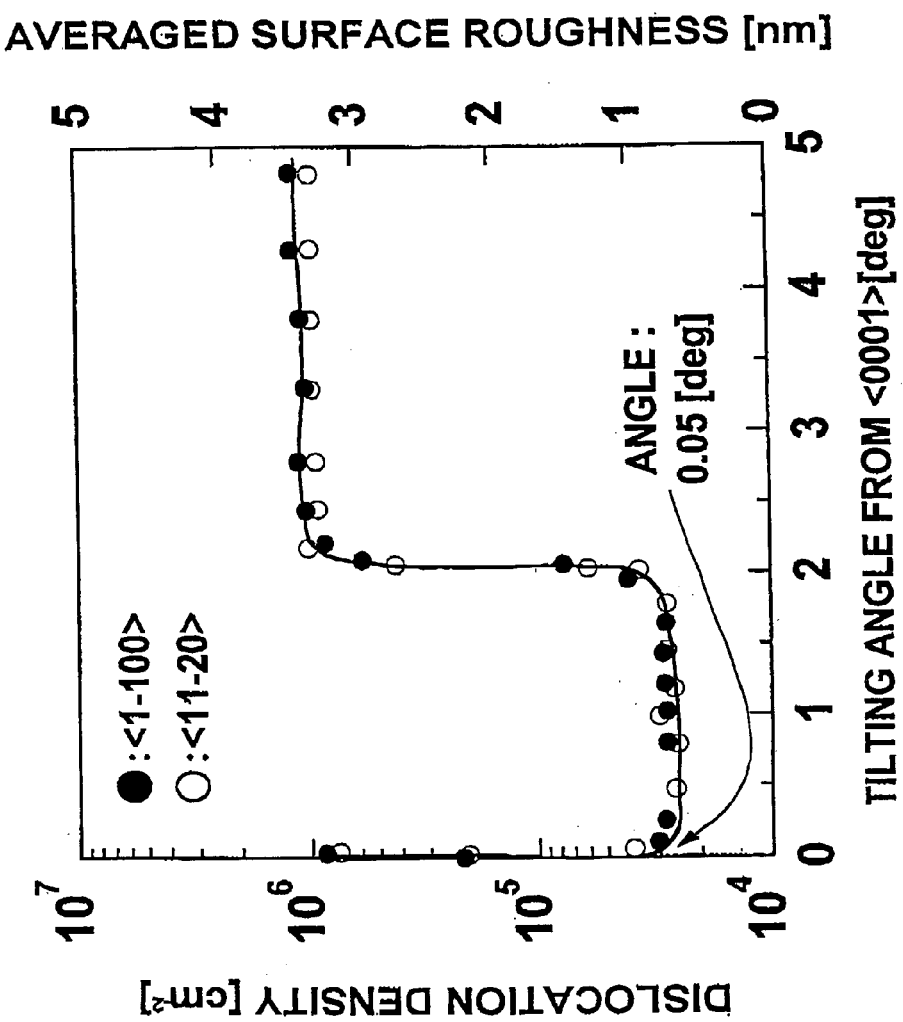
FIG. 7 is a graph illustrating a relationship between the tilt angle of a substrate surface, threading dislocation density, and averaged surface roughness according to the present invention.

FIG. 6 shows results of a hole density plotting for the Mg doped layers of an actual semiconductor light emitting device 1000 produced in accordance with the above method, the plotting being obtained through a hole measurement before electrodes are provided on the semiconductor light emitting device 1000. FIG. 7 shows a relationship between the threading dislocation density in the semiconductor light emitting device 1000 according to the present example as is evaluated through a cross-section TEM observation, and the surface roughness as measured with a stepmeter. In FIGS. 6 and 7, "●" plots represent results obtained with a substrate tilt in the <1-100> direction from the <0001> direction; and "603" plots represent results obtained with a substrate tilt in the <11-20> direction from the <0001> direction. In either cases, when the tilt angle of the substrate is in the range from about 0.020° to about 0.045° or in the range from about 2.1° to about 5°, the tilt in the substrate surface causes crystal malformation, and hence a high concentration of threading dislocations and substantial surface roughness. As a result, the hole density in those cases was too low to be measured. Moreover, dot-like regions having a diameter of several nm were observed in the active layer 106 due to In concentration.

On the other hand, when the tilt angle of the substrate is in the range from about 0.05° to about 2°, the threading dislocations were reduced, and the hole density was at least $10^{17}$ cm$^{-3}$ or more. Thus, it will be appreciated that a sufficient hole density can be obtained "as grown" according to the present example of the invention. In addition, the averaged surface roughness of the active layer 106 was reduced to about 1.8 nm or less, which is sufficiently smaller than the thickness of each individual well layer In the quantum well structure. A cross-section TEM observation revealed that the surface flatness was already improved at the time of growing the underlying n-GaN layer 103. Since the reduced threading dislocation density substantially eliminates the In concentration in the active layer 106, substantially non-uniform dot-like regions were scarcely observed. Thus, improved flatness of the underlying layers improved the fluctuation in the thickness of the quantum well structure active layer 106.

Figure 8:
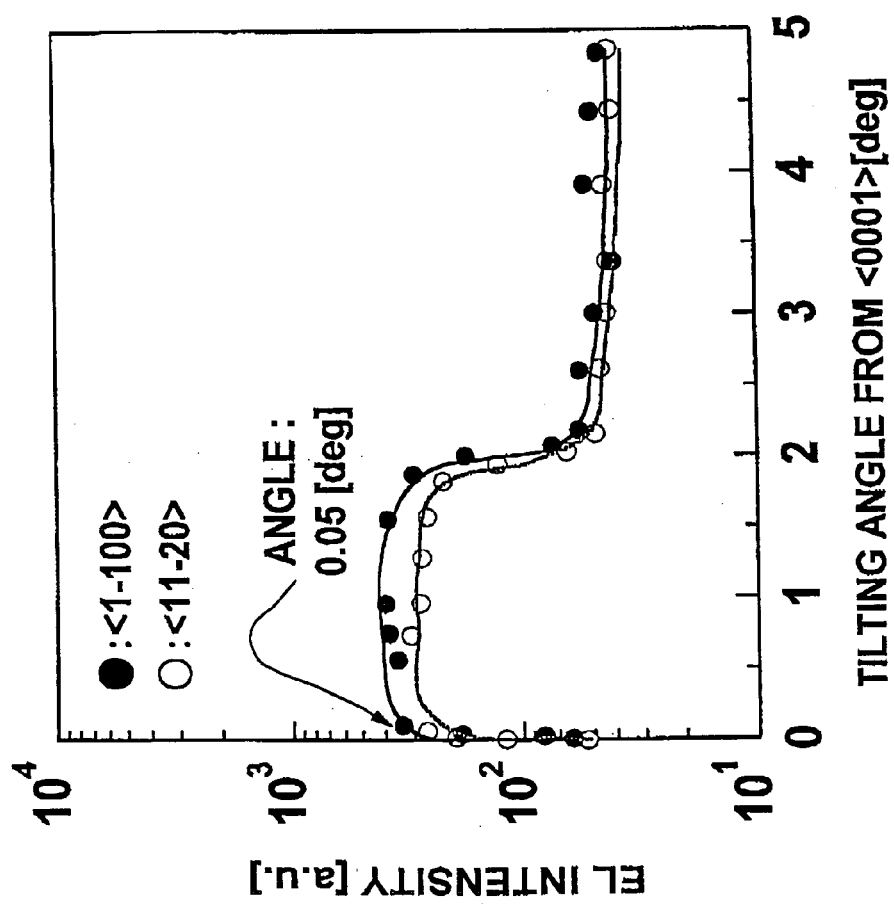
FIG. 8 shows a relationship between the tilt angle of substrate surface and emission intensity of a semiconductor light emitting device according to the present invention.
Figure 9:
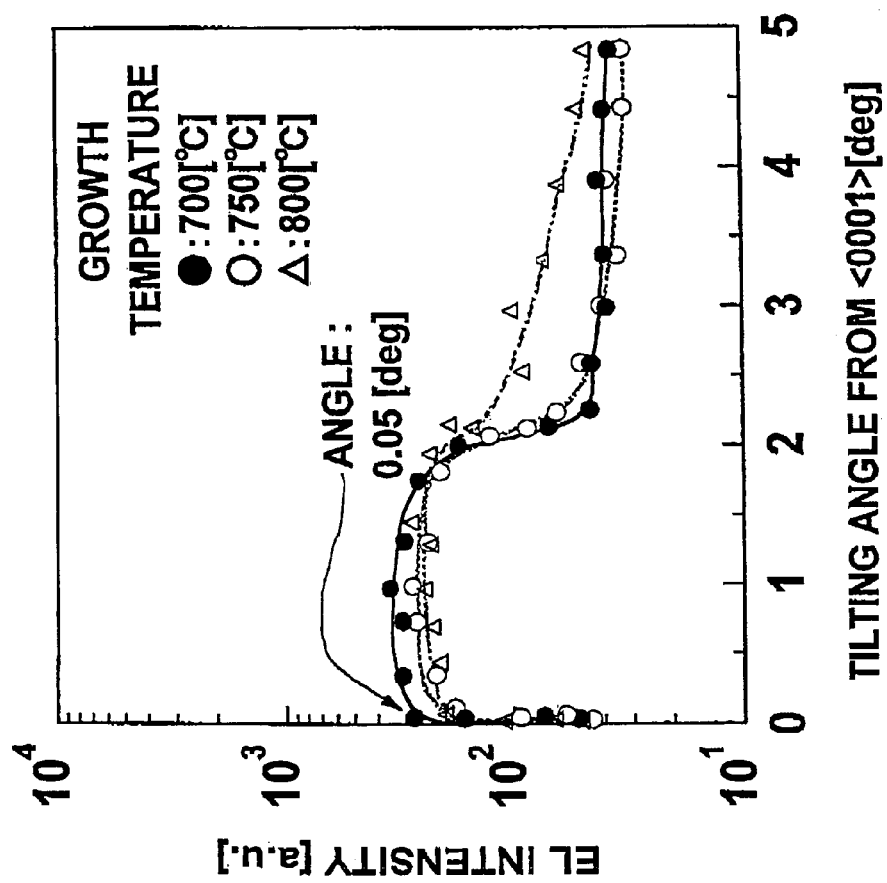
FIG. 9 is a graph illustrating a relationship between the tilt angle of substrate surface and emission intensity of a semiconductor light emitting device according to the present invention, where the growth temperature for an active layer is varied.

FIG. 8 shows a relationship between the emission intensity and the tilt angle of the substrate tilted in the <11-20> direction or <1-100> from the <0001> direction, in a case where a 20 mA current was flowed in the semiconductor light emitting device 1000 according to the present example of the invention. FIG. 9 shows measurement results of the emission intensity when the growth temperature for the active layer 106 was varied between about 700° C., about 750° C., and about 800° C. In FIG. 9, "●" plots represent results obtained with a growth temperature of about 700° C.; "○" plots represent results obtained with a growth temperature of about 750° C.; and "Δ" plots represent results obtained with a growth temperature of about 800°C. As seen from FIGS. 8 and 9, the emission intensity is enhanced when the tilt angle of the substrate is in the range from about 0.05° to about 2°, although the influence of the tilt angle of the substrate on emission intensity has a slight dependence on the growth temperature for the active layer 106. As seen from the results shown in FIGS. 7, 8, and 9, there is a clear correlation between threading dislocations and emission intensity. Thus, it has been found that the semiconductor light emitting device 1000 according to the present invention provides an emission intensity which is equal to or greater than that provided by a semiconductor light emitting device produced according to a conventional technique, while requiring a smaller driving current. This indicates that the current paths not contributing to emission are reduced according to the present invention. Although the active layer 106 according to the present example is illustrated as including three well layers 121, it has been found that similar effects to those provided under the present example can be obtained with multiple quantum well structures having two well layers 121, or any number of well layers between four to ten.

It has also been found that, in the case where the semiconductor light emitting device 1000 is produced as a laser device using a slightly-tilted GaN substrate 101 having a tilt angle from about 0.05° to about 2°, the threshold current density at which oscillation begins is decreased with improved emission intensity, and that emission intensity for the same level of current is improved relative to that provided by a semiconductor light emitting device produced according to a conventional technique.

EXAMPLE 3

Figure 10:
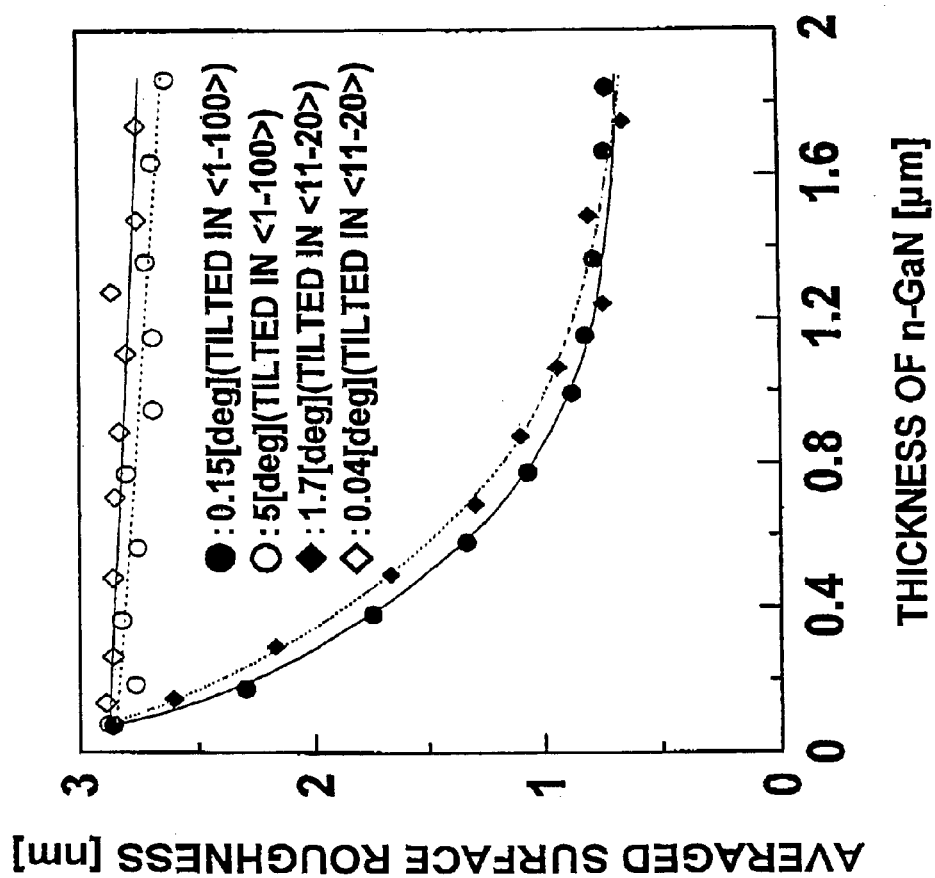
FIG. 10 is a graph illustrating a relationship between the total thickness of underlying n-GaN layers and averaged surface roughness of a uppermost growth surface according to the present invention.

A semiconductor light emitting device 1000 was produced by a method similar to Example 2 while varying the thickness of the n-GaN layer 103, except that the growth temperature for the active layer 106 was fixed at about 750° C. FIG. 10 shows results of a surface roughness plotting for the semiconductor light emitting device 1000 according to the present example with respect to the total thickness of the underlying layers between the substrate 101 and the active layer 106.

In FIG. 10, "●" plots represent results obtained with a substrate tilt angle of 0.15° in the <1-100> direction from;

"○" plots represent results obtained with a substrate tilt angle of 5° in the <1-100> direction; "♦" plots represent results obtained with a substrate tilt angle of 1.7° in the <11-20> direction; and "◇" plots represent results obtained with a substrate tilt angle of 0.04° in the <11-20> direction. From FIG. 10, it can be seen that, irrespective of the crystal orientation, the flatness of the uppermost surface of the device is improved with an increased thickness when the tilt angle of the substrate is in the range from about 0.15° to about 1.7°. Moreover, in the case where the semiconductor light emitting device 1000 is produced so that the underlying layers between the substrate 101 and the active layer 106 have a total thickness of about 1 μm or more, the uppermost surface has a surface roughness which is smaller than the thickness of each individual layer in the quantum well structure. Thus, it has been indicated that a satisfactory quantum well structure can be obtained when the underlying layers between the substrate 101 and the active layer 106 have at least a total thickness of about 1 μm in or more.

Although the present example illustrates various thicknesses of the GaN layer 103, similar results were also obtained with underlying layers composed of InGaN or AlGaN. The same tendency was also observed in the case where the underlying layers are composed of a plurality of InAlGaN layers of different compositions; i.e., the flatness of the uppermost surface of the resultant device was improved with a total underlying layer thickness of about 1 μm or more, irrespective of the composition or the number of layers included.

Figure 11:
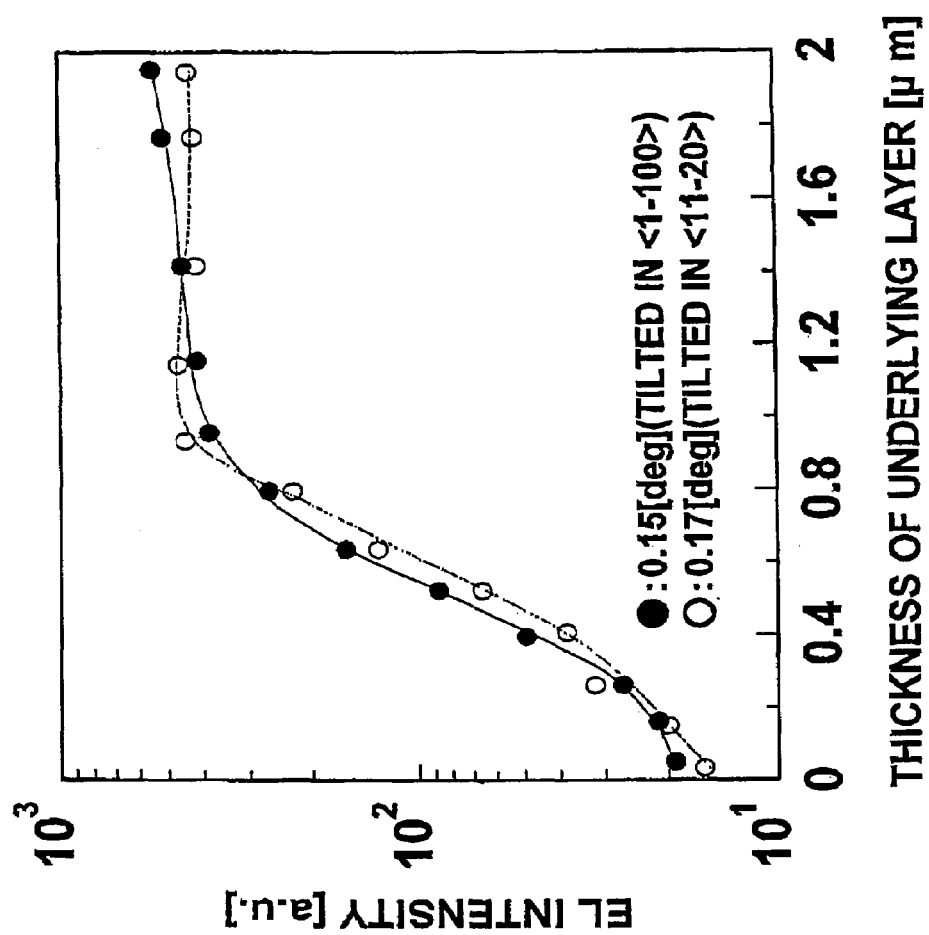
FIG. 11 is a graph illustrating a relationship between the total thickness of underlying layers and emission intensity of a semiconductor light emitting device according to the present invention.

FIG. 11 shows a relationship between the emission intensity and the total thickness of the underlying layers between the GaN substrate 101 and the active layer 106 with respect to the semiconductor light emitting device 1000 produced on a mirror-polished slightly-tilted GaN substrate 101 while varying the thickness of the n-GaN layer 103, with a 20 mA current being applied via the electrodes. In FIG. 11, "●" plots represent results obtained with a substrate tilt angle of 0.150° in the <1-100> direction from; and "○" plots represent results obtained with a substrate tilt angle of 0.17° in the <11-20> direction. From FIG. 11, it can be seen that, in either case, an improved emission intensity is provided when the underlying layers between the substrate 101 and the active layer 106 have a total thickness of about 1 μm or more. This is presumably because the improved flatness of the uppermost surface of the device leads to reduced fluctuation in the thickness of the active layer 106 and reduced fluctuation in the In component ratio.

Although the active layer 106 according to the present example is illustrated as including three well layers 121, it has been found that similar effects to those provided under the present example can be obtained with multiple quantum well structures having two well layers 121, or any number of well layers 121 between four to ten.

It has also been found that, in the case where the semiconductor light emitting device 1000 is produced as a laser device, using a slightly-tilted GaN substrate 101 having a tilt angle from about 0.05° to about 2° in such a manner that the underlying layers between the substrate 101 and the active layer 106 have a total thickness of about 1 μm or more, the threshold current density at which oscillation begins is decreased with improved emission intensity, and that emission intensity for the same level of current is improved relative to that provided by a semiconductor light emitting device produced according to a conventional technique.

EXAMPLE 4

In Example 4 of the present invention, a semiconductor light emitting device 1000 in the form of an LED is produced, using the above-described growth wait period technique on a slightly-tilted substrate 101. In the present example, the relationship between the emission intensity when a current is injected to the resultant LED and the waiting time observed after growing each barrier layer 120 in the active layer 106 will be discussed.

By using a GaN substrate having a mirror-polished (0001) plane whose crystal orientation is actually tilted away from the <0001> direction by 0.15° in the <1-100> direction, a nitride compound semiconductor multilayer structure it grown in the manner shown in Example 1.

Figure 1C:
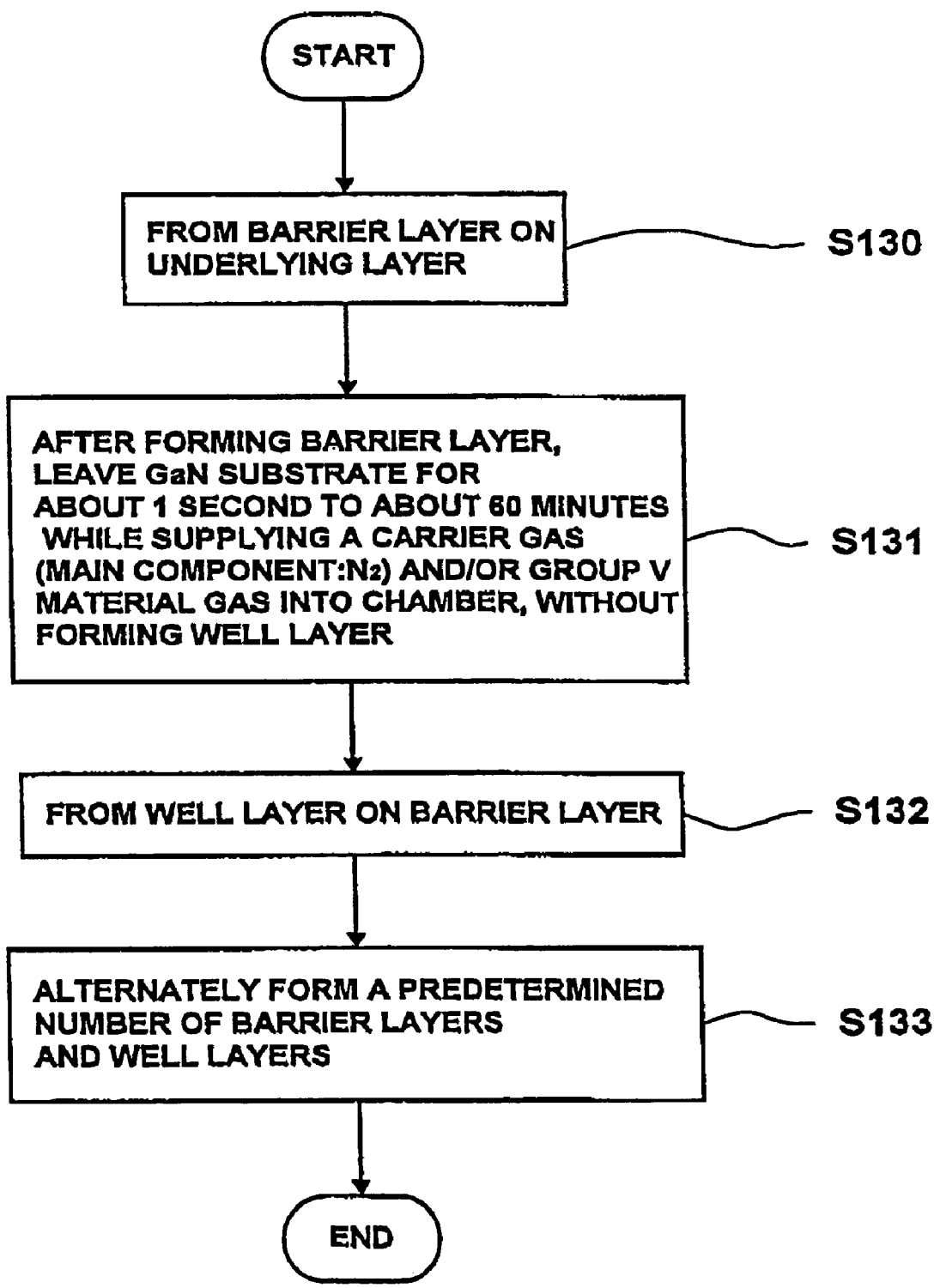
FIG. 1C is a flow chart illustrating steps for producing an active layer of a light emitting device according to one embodiment of the invention.

Now, steps for producing the active layer 106 according to the present example of the invention will be described with reference to a flow chart shown in FIG. 1C. After an n-GaN layer 103 is formed, growth conditions for the active layer 106 are adjusted so that a constant substrate temperature is maintained while supplying $NH_3$. Once a stable substrate temperature is achieved, TMG, TMI, and $SiH_4$ are supplied, at flow rates of about 10 μmol/min. about 10 μmol/min, and 5 nmol/min, respectively, thereby forming an $In_{0.05}Ga_{0.95}N$ barrier layer 120 (FIG. 1B) within an active layer 106 so as to have a thickness of about 5 nm (step S130). Next, the supply of TMG, TMI, and $SiH_4$ is stopped, and a predetermined wait period is observed while supplying a carrier gas and an $NH_3$ gas (step S131). Thereafter, TMG, TMI, and $SiH_4$ are again supplied, at flow rates of about 10 μmol/min, about 50 μmol/min, and 5 nmol/min, respectively, thereby forming an $In_{0.2}Ga_{0.6}N$ well layer 121 within the active layer 106 so as to have a thickness of about 3 nm (step S132). After growing the well layer 121, the TMG supply is reduced to about 10 μmol/min, and another barrier layer 120 within the active layer 106 is grown. After that barrier layer 120 has been grown, a predetermined Wait period is observed, and then another well layer 121 is grown, and so forth; this process is repeated until a final barrier layer 120 is grown (step S133).

Thereafter, an AlGaN layer 107 for preventing sublimation of the InGaN layer is grown so as to have a thickness of about 30 nm, following the method described in Example 1. A wait period may or may not be observed between the growth of the final InGaN barrier layer 120 In the active layer 106 and the growth of the AlGaN layer 107. However, it has been found that in the case where the active layer 106 includes two or less well layers 121, observing a wait period after the growth of the final InGaN barrier layer 120 in the active layer 106 makes for a higher emission intensity responsive to a current injection in the semiconductor light emitting device 1000. According to the present example, the active layer 106 includes three well layers 121.

After growing the AlGaN layer 107, a p-type semiconductor multilayer structure is formed, and electrodes are formed, in the manner described in Example 1. Thus, the semiconductor light emitting device 1000 as an LED is completed.

Figure 12:
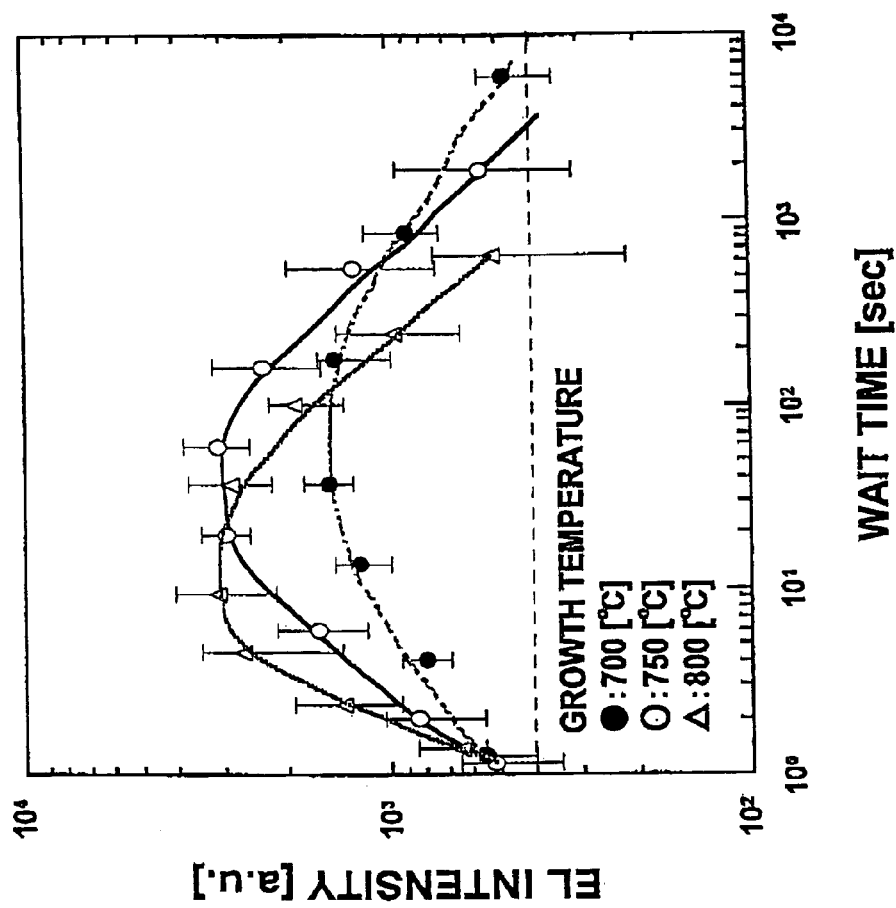
FIG. 12 is a graph illustrating a relationship between wait period observed after growing each barrier layer and emission intensity of a semiconductor light emitting device according to the present invention.

FIG. 12 shows a relationship between the emission intensity and the waiting time observed after forming each barrier layer 120, In a case where a 20 mA current was flowed in the semiconductor light emitting device 1000 according to the present example of the invention. FIG. 12 shows measurement results of the emission intensity when the growth temperature for the active layer 106 was varied between about 700° C. about 750° C., and about 800° C. In FIG. 12, "●" plots represent results obtained with a growth temperature of 700° C.; "○" plots represent results obtained with a growth temperature of 750° C.; and "Δ" plots represent results obtained with a growth temperature of about 800° C. A dotted line in FIG. 12 represents an emission intensity of 400 a.u. (arbitrary units), which is obtained when a zero waiting time is observed for each growth temperature. The intensity level denoted by the "●", "○", or "Δ" symbol represents an average emission intensity associated with each growth temperature.

As seen from FIGS. 8, 9, and 12, the emission intensity is further enhanced by applying a growth wait period technique in addition to the use of a slightly-tilted substrate 101.

As seen from FIG. 12, the emission intensity is enhanced when a waiting time of 1 second or more is observed, although the influence of the waiting time on emission intensity has a slight dependence on the growth temperature for the active layer 106. A relatively long waiting time provides a significant improvement on the emission intensity in the case where a low growth temperature is used for forming the active layer 106; on the other hand, a relatively short waiting time provides a significant improvement on the emission intensity in the case where a high growth temperature is used for forming the active layer 106.

Specifically, as seen from FIG. 12, in the case where the growth temperature for the active layer 106 is about 700° C., a waiting time in the range from about 1 second to about 60 minutes provides a significant improvement on the emission intensity, and a waiting time in the range from about 1 second to about 10 minutes provides a particularly significant improvement. In the case where the growth temperature for the active layer 106 in about 750° C., a waiting time in the range from about 1 second to about 15 minutes provides a significant improvement on the emission intensity, and a waiting time in the range from about 1 second to about 5 minutes provides a particularly significant improvement. In the case where the growth temperature for the active layer 106 is about 800° C., a waiting time in the range from about 1 second to about 5 minutes provides a significant improvement on the emission intensity, and a waiting time in the range from about 1 second to about 2 minutes provides a particularly significant improvement.

It should also be noted that the above effect was most prominent when the time spent for growing each pair of a barrier layer 120 and a well layer 121, including the waiting time observed in between, was in the range from about 10 seconds to about 120 minutes.

Although the present example illustrates the use of a slightly-tilted GaN substrate 101 having a mirror-polished (0001) plane whose crystal orientation is actually tilted away from the <0001> direction by 0.15° in the <1-100> direction, It has been confirmed that a tilt in any other direction exhibits similar effects so long as the tilt angle is in the range from about 0.05° to about 2°.

Although the active layer 106 according to the present example is illustrated as including three well layers 121, it has been found that similar effects to those provided under the present example can be obtained with multiple quantum well structures having two well layers 121, or any number of well layers 121 between four to ten.

It has also been found that in the case where the semiconductor light emitting device 1000 is produced as a laser device by a method according to the present example, utilizing the above-described growth wait period technique, the threshold current density at which oscillation begins is decreased with improved emission intensity, and that emission intensity for the same level of current is improved relative to that provided by a semiconductor light emitting device produced according to a conventional technique.

EXAMPLE 5

In Example 5 of the present invention, a semiconductor light emitting device 1000 in the form of an LED is produced, using the above-described growth wait period technique on a GaN substrate having a mirror-polished (0001) plane whose crystal orientation is actually tilted away from the <0001> direction by 0.15° in the <1-100> direction. According to the present example, a predetermined wait period is observed after growing each barrier layer 120 within an active layer 106, and a predetermined wait period is observed after growing each well layer 121 within an active layer 106. In the present example, the relationship between the emission intensity when a current is injected to the resultant LED and the waiting time observed after growing each well layer 121 in the active layer 106 will be discussed. Thus, according to the present example, the step of leaving the substrate 101 for a predetermined waiting time (step S131) in the flowchart shown in FIG. 1C is performed not only after the formation of each barrier layer 120 but also after the formation of each well layer 121. Respective steps for forming the active layer 106 according to the present example of the invention will be described with reference to a flowchart shown in FIG. 1D. The method for growing each layer in the semiconductor light emitting device 1000 according to the present example is the same as that described in Example 3. Hereinafter, growth conditions for forming the active layer 106 will be described.

After an n-GaN layer 103 is formed, growth conditions for the active layer 106 are adjusted so that a constant substrate temperature is maintained while supplying $NH_3$. Once a stable substrate temperature is achieved, TMG, TMI, and $SiH_4$ are supplied, at flow rates of about 10 μmol/min, about 10 μmol/min, and 5 nmol/min, respectively, thereby forming an $In_{0.05}Ga_{0.95}N$ barrier layer 120 within an active layer 106 so as to have a thickness of about 5 nm (step S140). Next, the supply of TMG, TMI, and $SiH_4$ is stopped, and a predetermined wait period is observed while supplying a carrier gas and an $NH_3$ gas (step S141). Thereafter, TMG, TMI, and $SiH_4$ are again supplied, at flow rates of about 10 μmol/min, about 15 μmol/min, and 5 nmol/min, respectively, thereby forming an $In_{0.2}Ga_{0.8}N$ well layer 121 within the active layer 106 so as to have a thickness of about 5 nm (step S142). Next, the supply of TMG, TMI, and $SiH_4$ is stopped, and a predetermined wait period is observed while supplying a carrier gas and an $NH_3$ gas (step S143) Thus, after each barrier layer 120 is grown, a wait period is observed, and after each well layer 121 is grown, another wait period is observed, and so forth; this process of alternately forming adjoining layers of barrier layers 120 and well layers 121 is repeated until a final barrier layer 120 is grown (step S144).

Thereafter, an AlGaN layer 107 for preventing sublimation of the InGaN layer is grown so as to have a thickness of about 30 nm, following the method described in Example 1. A wait period may or may not be observed between the growth of the final InGaN barrier layer 120 in the active layer 106 and the growth of the AlGaN layer 107. However, it has been found that in the case where the active layer 106 includes two or less well layers 121, observing a wait period after the growth of the final InGaN barrier layer 120 in the active layer 106 makes for a higher emission intensity responsive to a current injection in the semiconductor light emitting device 1000. According to the present example, the active layer 106 includes three well layers 121, and the waiting time observed after growing each barrier layer 120 is about 60 seconds.

After growing the AlGaN layer 107, a p-type semiconductor multilayer structure is formed, and electrodes are farmed, in the manner described in Example 1. Thus, the semiconductor light emitting device 1000 as an LED is completed.

Figure 13:
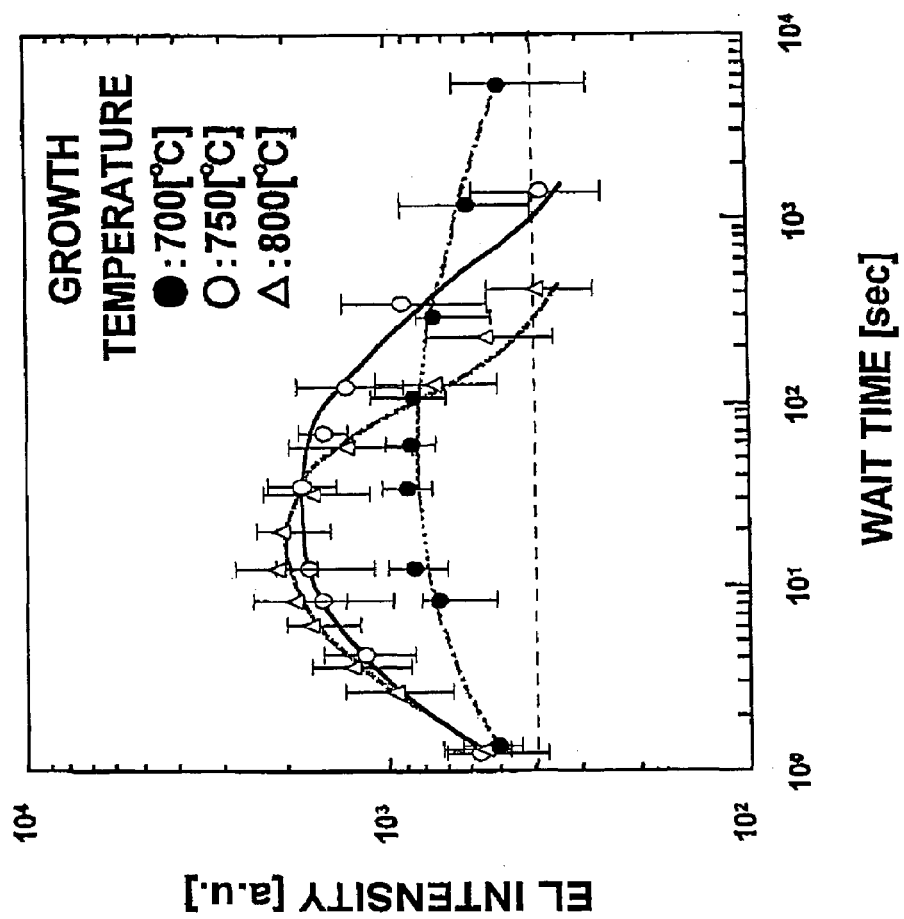
FIG. 13 is a graph illustrating a relationship between wait period observed after growing each well layer and emission intensity of a semiconductor light emitting device according to the present invention.

FIG. 13 shows a relationship between the emission intensity and the waiting time observed after forming each well layer 121, In a case where a 20 mA current was flowed in the semiconductor light emitting device 1000 according to the present example of the invention. FIG. 13 shows measurement results of the emission intensity when the growth temperature for the active layer 106 was varied between about 700° C., about 750° C., and about 800° C. In FIG. 13, "●" plots represent results obtained with a growth temperature of 700° C.; "○" plots represent results obtained with a growth temperature of 750° C.; and "Δ" plots represent results obtained with a growth temperature of about 800° C. A dotted line in FIG. 13 represents an emission intensity of 400 a.u. (arbitrary units), which is obtained when a zero waiting time is observed for each growth temperature. The intensity level denoted by the "●", "○", or "Δ" symbol represents an average emission intensity associated with each growth temperature.

As seen from FIGS. 8, 9, and 13, the emission intensity is further enhanced by applying a growth waiting technique period in addition to the use of a slightly-tilted substrate 101.

As seen from FIG. 13, the emission intensity is enhanced when a waiting time of 1 second or more is observed after the formation of each well layer 121, although the influence of the waiting time on emission intensity has a slight dependence on the growth temperature for the active layer 106. A relatively long waiting time provides a significant improvement on the emission intensity in the case where a low growth temperature is used for forming the active layer 106; on the other hand, a relatively short waiting time provides a significant improvement on the emission intensity in the case where a high growth temperature is used for forming the active layer 106.

Specifically, as seen from FIG. 13, in the case where the growth temperature for the active layer 106 is about 700° C., a waiting time in the range from about 1 second to about 60 minutes provides a significant improvement on the emission intensity, and a waiting time in the range from about 1 second to about 10 minutes provides a particularly significant improvement. In the case where the growth temperature for the active layer 106 is about 750° C., a waiting time in the range from about 1 second to about 15 minutes provides a significant improvement on the emission intensity, and a waiting time in the range from about 1 second to about 5 minutes provides a particularly significant improvement. In the case where the growth temperature for the active layer 106 is about 800° C., a waiting time in the range from about 1 second to about 5 minutes provides a significant improvement on the emission intensity, and a waiting time in the range from about 1 second to about 2 minutes provides a particularly significant improvement.

In the case where a wait period is observed only after the growth of each well layer 121, i.e., without observing a wait period after the growth of each barrier layer 120, the emission intensity is somewhat improved, but to a lesser degree than that illustrated in the graph of FIG. 12; the improvement in emission intensity is threefold at the most.

EXAMPLE 6

In Example 6 of the present invention, a semiconductor light emitting device 1000 in the form of an LED is produced, using a GaN substrate 101 having a mirror-polished (0001) plane whose crystal orientation is actually tilted away from the <0001> direction by 0.15° in the <1-100> direction, following the method described in Example 2, while varying the mixing ratio between a hydrogen gas and a nitrogen gas in a carrier gas which is supplied during a wait period after growing a barrier layer 120 within the active layer 106. In the present example, the relationship between the emission characteristics of the semiconductor light emitting device 1000 and the mixing ratio between a hydrogen gas and a nitrogen gas in a carrier gas which is supplied during a wait period after growing a barrier layer 120 within the active layer 106 will be discussed.

Figure 14:
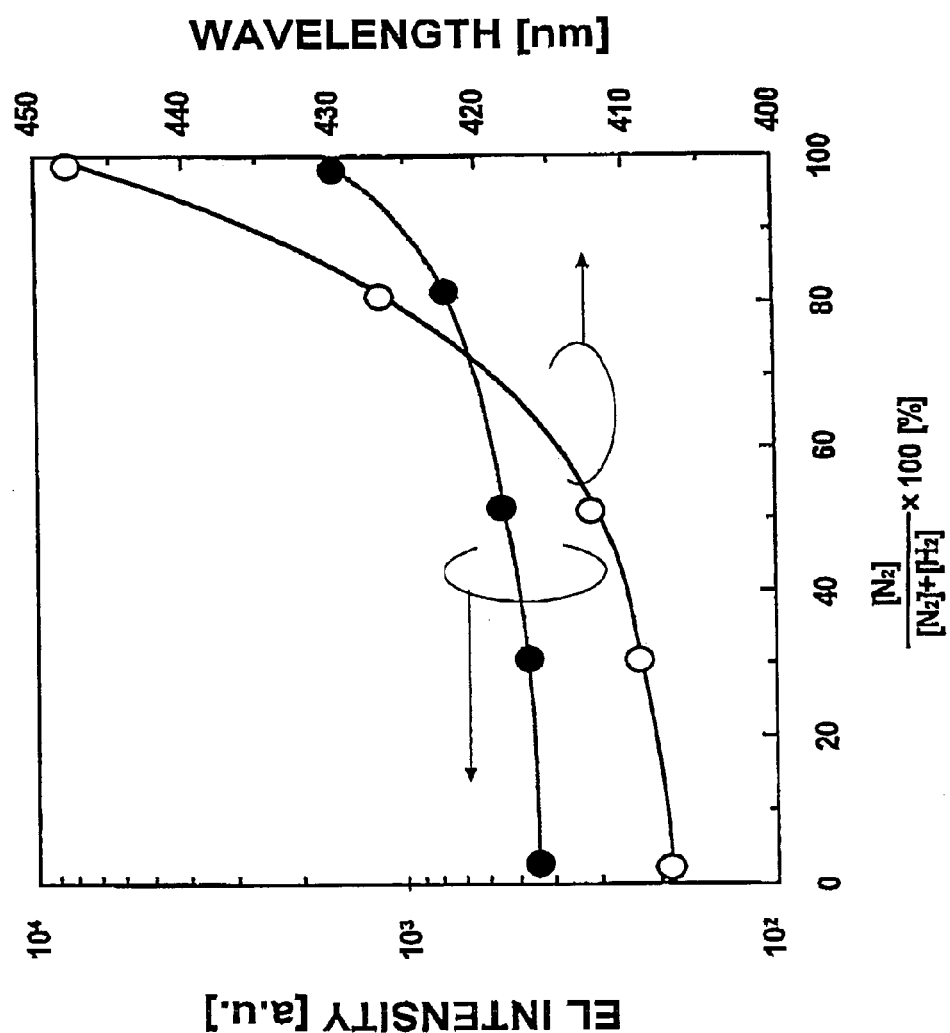
FIG. 14 is a graph illustrating a relationship between nitrogen partial pressure, emission intensity, and emission wavelength of a semiconductor light emitting device according to the present invention.

FIG. 14 shows a relationship between the emission intensity and emission wavelength of the semiconductor light emitting device 1000 and various mixing ratios between a hydrogen gas and a nitrogen gas in a carrier gas which is supplied during a wait period of about 60 seconds after growing a barrier layer 120, where the total supply rate of the carrier gas is maintained at a constant level and the growth temperature for the active layer 106 is fixed at about 750° C. In FIG. 14, "●" plots represent emission intensity (left vertical axis), and "○" plots represent emission wavelength (right vertical axis).

As shown in FIG. 14, the emission wavelength and the emission intensity tend to decrease as the $N_2$ component 10 in the carrier gas decreases. The same tendency is also exhibited when the growth temperature for the active layer 106 is as high as about 800° C. or as low as about 700° C. In the case where a wait period is observed not only after growing each barrier layer 120 but also after growing each well layer 121, an increased $N_2$ component in the carrier gas leads to increased emission intensity and greater emission wavelength.

EXAMPLE 7

In Example 7 of the present invention, a semiconductor light emitting device 1000 in the form of an LED is produced, using a GaN substrate 101 having a mirror-polished (0001) plane whose crystal orientation is actually tilted away from the <0001> direction by 0.15° in the <1-100> direction, following the method described in Example 2, while varying the flow rate of an $NH_3$ gas supplied during a wait period after growing a barrier layer 120 within the active layer 106. In the present example, the relationship between the emission intensity of the semiconductor light emitting device 1000 and the flow rate of an $NH_3$ gas supplied during a wait period after growing a barrier layer 120 within the active layer 106 will be discussed.

Figure 15:
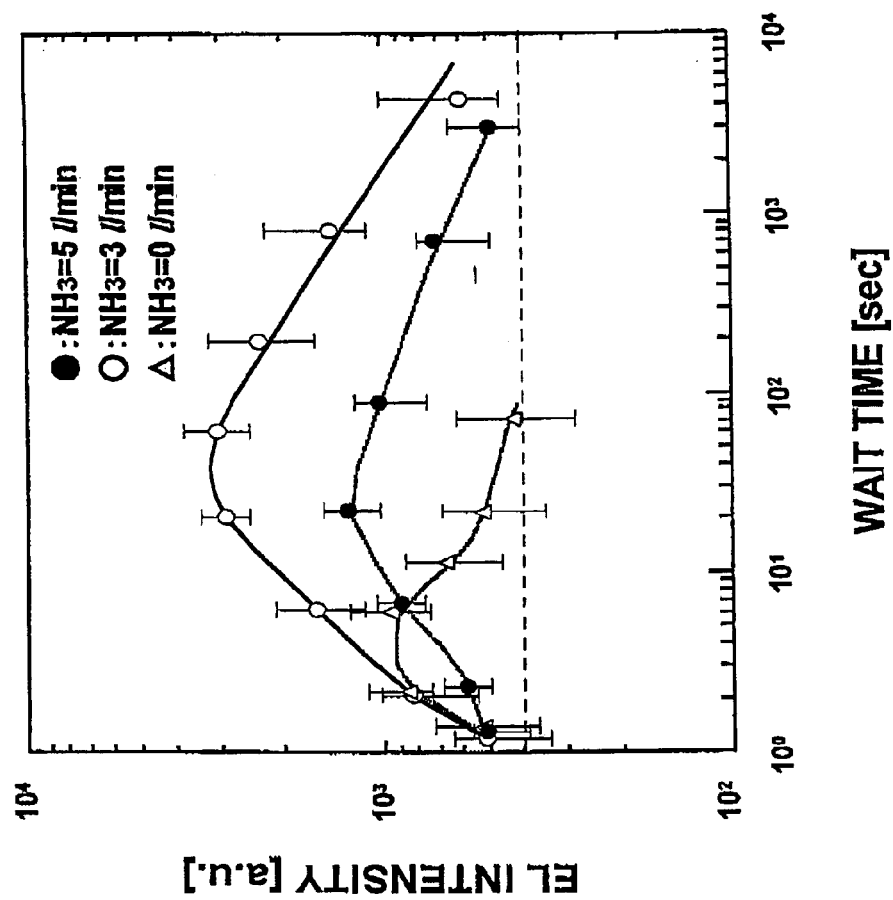
FIG. 15 is a graph illustrating a relationship between the flow rate of $NH_3$ supplied during a wait period and emission intensity of a semiconductor light emitting device according to the present invention.

FIG. 15 shows a relationship between the emission intensity of the semiconductor light emitting device 1000 and various flow rates of an $NH_3$ gas which is supplied during various lengths of wait periods after growing a barrier layer 120, where the growth temperature for the active layer 106 is fixed at about 750° C. In FIG. 15, "●" plots represent results obtained with $NH_3$ is supplied at a flow rate of about 5 l/min; "○" plots represent results obtained with $NH_3$ is supplied at a flow rate of about 3 l/min; and "Δ" plots represent results obtained with $NH_3$ is supplied at a flow rate of 0 (zero) l/min.

As shown in FIG. 15, it has been confirmed that the emission wavelength is enhanced even with a zero flow rate of $NH_3$; however, the supply of any non-zero amount of $NH_3$ has a positive enhancing effect on emission intensity, and also allows for a long wait period to be used, whereby the entire production process can be facilitated. The same tendency is also exhibited when the growth temperature for the active layer 106 is as high as about 800° C. or as low as about 700° C. The same tendency is also exhibited in the case where a wait period is observed not only after growing each barrier layer 120 but also after growing each well layer 121.

Examples 1 to 7 chiefly illustrate instances in which the present invention is applied to an LED. The inventors have confirmed through experimentation that the present invention can be applied to a laser device in order to effectively reduce a threshold current value thereof. In fact, semiconductor light emitting devices 1000 which were produced in the form of laser devices, by following the above-described methods for realizing high emission intensity in semiconductor light emitting devices 1000 as LEDs, exhibited laser oscillation with a low threshold current density. Thus, the present invention is effective for any light emitting devices generally composed of nitride compound semiconductor materials.

As described above, according to the present invention, a crystal is grown on a GaN substrate having a slightly-tilted crystal orientation, whereby a nitride compound semiconductor crystal exhibiting a p-type conductivity which has a hole density of about $10^{17}$ cm$^{-3}$ or above can be obtained "as grown", without performing a heat treatment or an electron beam irradiation. As a result, the contact resistance in the nitride compound semiconductor light emitting device according to the present invention can be effectively reduced, thereby providing for improved light emitting device characteristics. By ensuring that the underlying layers between the surface of the GaN substrate and an active layer have a total thickness of about 1 µm or more, and observing a predetermined wait period after growing each barrier layer and/or well layer in a multiple quantum well structure, there is provided a high-luminance nitride compound semiconductor light emitting device which can emit light with a relatively low driving current and/or operation voltage and which is unaffected by heating.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nitride compound semiconductor light emitting device comprising:
   a GaN substrate having a (0001) plane whose crystal orientation is tilted away from a <0001> direction in a <11-20> or <1-100> direction by an angle which is equal to or greater than 0.05° and which is less than 2°, and
   a n-type layer containing a nitride compound semiconductor located above the GaN substrate, and
   an active layer containing a nitride compound semiconductor located above the GaN substrate, and
   an acceptor doping layer containing a nitride compound semiconductor comprising $Ga_xIn_yAl_{1-(x+y)}N$ (where $0 \leq x \leq 1$; $0 \leq y \leq 1$; and $0 \leq x+y \leq 1$) located above the GaN substrate,
   wherein the GaN substrate and the active layer are formed so as to be apart from each other by a distance which is equal to or greater than about 1 µm.

2. A nitride compound semiconductor light emitting device according to claim 1, wherein the acceptor doping layer exhibits a p-type conductivity as grown.

3. A nitride compound semiconductor light emitting device according to claim 1, wherein the active layer has a quantum well structure, and the active layer has an averaged surface roughness which is equal to or less than a thickness of a well layer in the quantum well structure.

4. A nitride compound semiconductor light emitting device according to claim 1, wherein the active layer includes at least one well layer and at least one barrier layer.

5. A nitride compound semiconductor light emitting device according to claim 1, wherein said active layer is formed evenly with respect to a macroscopic view and a microscopic view relating to an order of thickness of the active layer.

6. A nitride compound semiconductor light emitting device according to claim 1, wherein said acceptor doping layer is formed evenly with respect to a macroscopic view and a microscopic view relating to an order of thickness of the active layer.

7. A nitride compound semiconductor light emitting device comprising:
   a GaN substrate having a (0001) plane whose crystal orientation is tilted away from a <0001> direction in a <11-20> or <1-100> direction by an angle which is equal to or greater than 0.05° and which is less than 2°, and
   a n-type layer containing a nitride compound semiconductor located above the GaN substrate, and
   an active layer containing a nitride compound semiconductor located above the GaN substrate, and
   an acceptor doping layer containing a nitride compound semiconductor comprising $Ga_xIn_yAl_{1-(x+y)}N$ (where $0 \leq x \leq 1$; $0 \leq y \leq 1$; and $0 \leq x+y \leq 1$) located above the GaN substrate, wherein the acceptor doping layer exhibits a p-type conductivity as grown.

8. A nitride compound semiconductor light emitting device according to claim 7, wherein the GaN substrate and the active layer are formed so as to be apart from each other by a distance which is equal to or greater than about 1 µm.

9. A nitride compound semiconductor light emitting device according to claim 8, wherein the active layer has a quantum well structure, and the active layer has an averaged surface roughness which is equal to or less than a thickness of a well layer in the quantum well structure.

10. A nitride compound semiconductor light emitting device according to claim 7, wherein the acceptor doping layer has a hole density of $10^{17}$ cm$^{-3}$ or more.

* * * * *